United States Patent
Kim

(10) Patent No.: US 11,678,542 B2
(45) Date of Patent: Jun. 13, 2023

(54) PIXEL OF AN ORGANIC LIGHT EMITTING DIODE DISPLAY DEVICE, AND ORGANIC LIGHT EMITTING DIODE DISPLAY DEVICE

(71) Applicant: Samsung Display Co., Ltd., Yongin-Si (KR)

(72) Inventor: Jeon Kyoo Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 138 days.

(21) Appl. No.: 17/177,245

(22) Filed: Feb. 17, 2021

(65) Prior Publication Data

US 2021/0351260 A1    Nov. 11, 2021

(30) Foreign Application Priority Data

May 11, 2020   (KR) .................. 10-2020-0055731

(51) Int. Cl.
*G09G 3/3275*    (2016.01)
*H10K 59/131*    (2023.01)
*G09G 3/3266*    (2016.01)

(52) U.S. Cl.
CPC ......... *H10K 59/131* (2023.02); *G09G 3/3266* (2013.01); *G09G 3/3275* (2013.01); *H10K 59/1213* (2023.02); *H10K 59/1216* (2023.02)

(58) Field of Classification Search
CPC .. G09G 3/3233; G09G 3/3266; G09G 3/3275; G09G 2320/045; G09G 2300/0852; G09G 2310/08; G09G 2300/0819; G09G 2300/0814; G09G 2300/0861; G09G 2300/0866; H01L 27/3265; H01L 27/3262; H01L 27/3276
See application file for complete search history.

(56) References Cited

U.S. PATENT DOCUMENTS

| | | | |
|---|---|---|---|
| 2012/0038605 A1* | 2/2012 | Han | G09G 3/3233 345/76 |
| 2014/0111563 A1* | 4/2014 | Hwang | G09G 3/003 345/691 |
| 2021/0074213 A1* | 3/2021 | Huang | G09G 3/3258 |

FOREIGN PATENT DOCUMENTS

| | | |
|---|---|---|
| KR | 10-2011-0078387 A | 7/2011 |
| KR | 10-1135534 B1 | 4/2012 |
| KR | 10-2017-0031321 A | 3/2017 |

(Continued)

*Primary Examiner* — Shaheda A Abdin
(74) *Attorney, Agent, or Firm* — Innovation Counsel LLP

(57) ABSTRACT

An organic light emitting diode (OLED) display device includes a first transistor including a gate electrode coupled to a first node, a second transistor including a gate receiving a first scan signal, a third transistor including a gate receiving the first scan signal, a fourth transistor including a gate receiving a second scan signal, a fifth transistor including a gate receiving the second scan signal, a sixth transistor including a gate receiving a third scan signal, a seventh transistor including a gate receiving an emission signal, a first capacitor including a first electrode coupled to a line of a first power supply voltage and a second electrode coupled to a second node, a second capacitor including a first electrode coupled to the second node and a second electrode coupled to the first node, and the OLED including an anode and a cathode coupled to a second power supply voltage.

20 Claims, 19 Drawing Sheets

(56) References Cited

FOREIGN PATENT DOCUMENTS

KR 10-1768473 B1 8/2017
KR 10-1962860 B1 3/2019

* cited by examiner

PIXEL OF AN ORGANIC LIGHT EMITTING DIODE DISPLAY DEVICE, AND ORGANIC LIGHT EMITTING DIODE DISPLAY DEVICE

CROSS-REFERENCE TO RELATED APPLICATION(S)

This application claims priority under 35 USC § 119 to Korean Patent Application No. 10-2020-0055731, filed on May 11, 2020 in the Korean Intellectual Property Office (KIPO), the disclosure of which is incorporated herein by reference in its entirety.

BACKGROUND

1. Field

Example embodiments of the present disclosure relate to a display device, and more particularly to a pixel of an organic light emitting diode (OLED) display device, and the OLED display device.

2. Description of the Related Art

Recently, the demand for an organic light emitting diode (OLED) has dramatically increased due to high demand from information technology (IT) sector. However, there are still many issues associated with the OLED display device. One of them is that the OLED display may consume most of power from the device. Therefore, reduction of power consumption may be desirable in the OLED display device employed in a portable device, such as a smartphone, a tablet computer, etc. Recently, in order to reduce the power consumption of the OLED display device, a low frequency driving technique which drives or refreshes a display panel at a frequency lower than a normal driving frequency by analyzing image data has been developed. For example, when performing low frequency driving, the OLED display device may not drive the display panel at least one frame, or may not provide data signals to the display panel such that the display panel displays an image based on stored data signals, thereby reducing the power consumption.

However, while the display panel displays the image based on the stored data signals, the stored data signals may be distorted by leakage currents of transistors included in pixels of the display panel. Thus, when a driving frequency of the display panel is changed, luminance of the display panel may be changed, and an image quality of the OLED display device may be degraded. Thus, there is need for a novel OLED display device which maintains uniform luminance so that an image quality is not degraded when a driving frequency of a display panel is changed.

SUMMARY

Some example embodiments provide a pixel of an organic light emitting diode (OLED) display device capable of having substantially uniform luminance even if a driving frequency is changed.

Some example embodiments provide an OLED display device capable of having substantially uniform luminance even if a driving frequency is changed.

According to example embodiments, there is provided a pixel of an OLED display device. The pixel includes a first transistor including a gate electrode coupled to a first node, a first terminal coupled to a line of a first power supply voltage, and a second terminal, a second transistor including a gate receiving a first scan signal, a first terminal coupled to a line of an initialization voltage, and a second terminal coupled to the first node, a third transistor including a gate receiving the first scan signal, a first terminal coupled to the line of the initialization voltage, and a second terminal coupled to an anode of an organic light emitting diode, a fourth transistor including a gate receiving a second scan signal, a first terminal coupled to a line of a reference voltage, and a second terminal coupled to a second node, a fifth transistor including a gate receiving the second scan signal, a first terminal coupled to the second terminal of the first transistor, and a second terminal coupled to the first node, a sixth transistor including a gate receiving a third scan signal, a first terminal coupled to a data line, and a second terminal coupled to the second node, a seventh transistor including a gate receiving an emission signal, a first terminal coupled to the second terminal of the first transistor, and a second terminal coupled to the anode of the organic light emitting diode, a first capacitor including a first electrode coupled to the line of the first power supply voltage, and a second electrode coupled to the second node, a second capacitor including a first electrode coupled to the second node, and a second electrode coupled to the first node, and the organic light emitting diode including the anode, and a cathode coupled to a line of a second power supply voltage.

In example embodiments, the first and seventh transistors may be PMOS transistors, and the second, third, fourth, fifth and sixth transistors may be NMOS transistors.

In example embodiments, a frame period for the pixel may include a gate and anode initialization period in which the gate of the first transistor and the anode of the organic light emitting diode are initialized, a threshold voltage compensation period in which a threshold voltage of the first transistor is compensated, a data writing period in which a data voltage of the data line is applied to the second node, and an emission period in which the organic light emitting diode emits light.

In example embodiments, in the gate and anode initialization period, the emission signal may have an off level, the first scan signal may have an on level, the second and third scan signals may have off levels respectively, the second and third transistors may be turned on, the second transistor may apply the initialization voltage to the first node, and the third transistor may apply the initialization voltage to the anode of the organic light emitting diode.

In example embodiments, in the threshold voltage compensation period, the emission signal may have an off level, the second scan signal may have an on level, the first and third scan signals may have off levels respectively, the fourth and fifth transistors may be turned on, the fourth transistor may apply the reference voltage to the second node, the fifth transistor may diode-connect the first transistor, and a voltage where the threshold voltage is subtracted from the first power supply voltage may be applied through the diode-connected first transistor to the first node.

In example embodiments, in the data writing period, the emission signal may have an off level, the third scan signal may have an on level, the first and second scan signals may have off levels respectively, the sixth transistor may be turned on, and the sixth transistor may apply the data voltage to the second node.

In example embodiments, in the emission period, the emission signal may have an on level, the first, second and third scan signals may have off levels respectively, the seventh transistor may be turned on, the first transistor may generate a driving current based on a voltage of the first node, and the seventh transistor may provide the driving current to the organic light emitting diode.

In example embodiments, a time length of the threshold voltage compensation period may be longer than a time length of the data writing period.

In example embodiments, the gate and anode initialization period, the threshold voltage compensation period and the data writing period may have an equal time length.

In example embodiments, the pixel may further include an eighth transistor including a gate receiving a fourth scan signal, a first terminal receiving the emission signal, and a second terminal coupled to the second terminal of the first transistor.

In example embodiments, the first transistor may be a PMOS transistor, and the second, third, fourth, fifth, sixth, seventh and eighth transistors may be NMOS transistors.

In example embodiments, a frame period for the pixel may include a gate and anode initialization period in which the gate of the first transistor and the anode of the organic light emitting diode are initialized, a drain initialization period in which the second terminal of the first transistor is initialized, a threshold voltage compensation period in which a threshold voltage of the first transistor is compensated, a data writing period in which a data voltage of the data line is applied to the second node, and an emission period in which the organic light emitting diode emits light.

In example embodiments, in the drain initialization period, the emission signal may have an off level, the fourth scan signal may have an on level, the first, second and third scan signals may have off levels respectively, the eighth transistor may be turned on, and the eighth transistor may apply the emission signal having the off level to the second terminal of the first transistor.

In example embodiments, the drain initialization period may be located between the gate and anode initialization period and the threshold voltage compensation period, and may not overlap the gate and anode initialization period and the threshold voltage compensation period.

In example embodiments, the drain initialization period may be located between the gate and anode initialization period and the threshold voltage compensation period, and may partially overlap the gate and anode initialization period and the threshold voltage compensation period.

In example embodiments, in a period where the drain initialization period and the threshold voltage compensation period overlap each other, the emission signal may have an off level, the second and fourth scan signals may have on levels respectively, the first and third scan signals may have off levels respectively, the fifth and eighth transistors may be turned on, and the emission signal having the off level may be applied through the eighth transistor and the fifth transistor to the first node.

According to example embodiments, there is provided a pixel of an OLED display device. The pixel includes a first transistor including a gate electrode coupled to a first node, a first terminal coupled to a line of a first power supply voltage, and a second terminal, a second transistor including a gate receiving a first scan signal, a first terminal coupled to a line of an initialization voltage, and a second terminal coupled to the first node, a third transistor including a gate receiving a fourth scan signal, a first terminal coupled to the line of the initialization voltage, and a second terminal coupled to an anode of an organic light emitting diode, a fourth transistor including a gate receiving a second scan signal, a first terminal coupled to a line of a reference voltage, and a second terminal coupled to a second node, a fifth transistor including a gate receiving the second scan signal, a first terminal coupled to the second terminal of the first transistor, and a second terminal coupled to the first node, a sixth transistor including a gate receiving a third scan signal, a first terminal coupled to a data line, and a second terminal coupled to the second node, a seventh transistor including a gate receiving an emission signal, a first terminal coupled to the second terminal of the first transistor, and a second terminal coupled to the anode of the organic light emitting diode, a first capacitor including a first electrode coupled to the line of the first power supply voltage, and a second electrode coupled to the second node, a second capacitor including a first electrode coupled to the second node, and a second electrode coupled to the first node, and the organic light emitting diode including the anode, and a cathode coupled to a line of a second power supply voltage.

In example embodiments, the first, third and seventh transistors may be PMOS transistors, and the second, fourth, fifth and sixth transistors may be NMOS transistors.

In example embodiments, the fourth scan signal may be an inverted version of the first scan signal.

According to example embodiments, there is provided an OLED display device including a display panel including a plurality of pixels, a data driver configured to provide data signals to the plurality of pixels, a scan driver configured to provide a first scan signal, a second scan signal and a third scan signal to the plurality of pixels, an emission driver configured to provide an emission signal to the plurality of pixels, and a controller configured to control the data driver, the scan driver and the emission driver. Each of the plurality of pixels includes a first transistor including a gate electrode coupled to a first node, a first terminal coupled to a line of a first power supply voltage, and a second terminal, a second transistor including a gate receiving a first scan signal, a first terminal coupled to a line of an initialization voltage, and a second terminal coupled to the first node, a third transistor including a gate receiving the first scan signal, a first terminal coupled to the line of the initialization voltage, and a second terminal coupled to an anode of an organic light emitting diode, a fourth transistor including a gate receiving a second scan signal, a first terminal coupled to a line of a reference voltage, and a second terminal coupled to a second node, a fifth transistor including a gate receiving the second scan signal, a first terminal coupled to the second terminal of the first transistor, and a second terminal coupled to the first node, a sixth transistor including a gate receiving a third scan signal, a first terminal coupled to a data line, and a second terminal coupled to the second node, a seventh transistor including a gate receiving an emission signal, a first terminal coupled to the second terminal of the first transistor, and a second terminal coupled to the anode of the organic light emitting diode, a first capacitor including a first electrode coupled to the line of the first power supply voltage, and a second electrode coupled to the second node, a second capacitor including a first electrode coupled to the second node, and a second electrode coupled to the first node, and the organic light emitting diode including the anode, and a cathode coupled to a line of a second power supply voltage.

As described above, in a pixel of an OLED display device and the OLED display device, a pixel may include a first transistor, a second transistor, a third transistor, a fourth transistor, a fifth transistor, a sixth transistor, a seventh transistor, a first capacitor, a second capacitor and an organic light emitting diode, and a portion of the first through seventh transistors may be implemented with an NMOS transistor. Accordingly, even if a driving frequency of a display panel including the pixel is changed, the pixel may emit light with substantially uniform luminance at the same gray level.

BRIEF DESCRIPTION OF THE DRAWINGS

Illustrative, non-limiting example embodiments will be more clearly understood from the following detailed description in conjunction with the accompanying drawings.

FIG. 2 is a timing diagram for describing an example of an operation of a pixel according to example embodiments.

FIG. 7 is a timing diagram for describing another example of an operation of a pixel according to example embodiments.

FIG. 8 is a timing diagram for describing still another example of an operation of a pixel according to example embodiments.

FIG. 10 is a timing diagram for describing an example of an operation of a pixel according to example embodiments.

FIG. 12 is a timing diagram for describing an example of an operation of a pixel according to example embodiments.

FIG. 14 is a timing diagram for describing another example of an operation of a pixel according to example embodiments.

DETAILED DESCRIPTION OF THE EMBODIMENTS

Hereinafter, embodiments of the present disclosure will be explained in detail with reference to the accompanying drawings.

Figure 1:
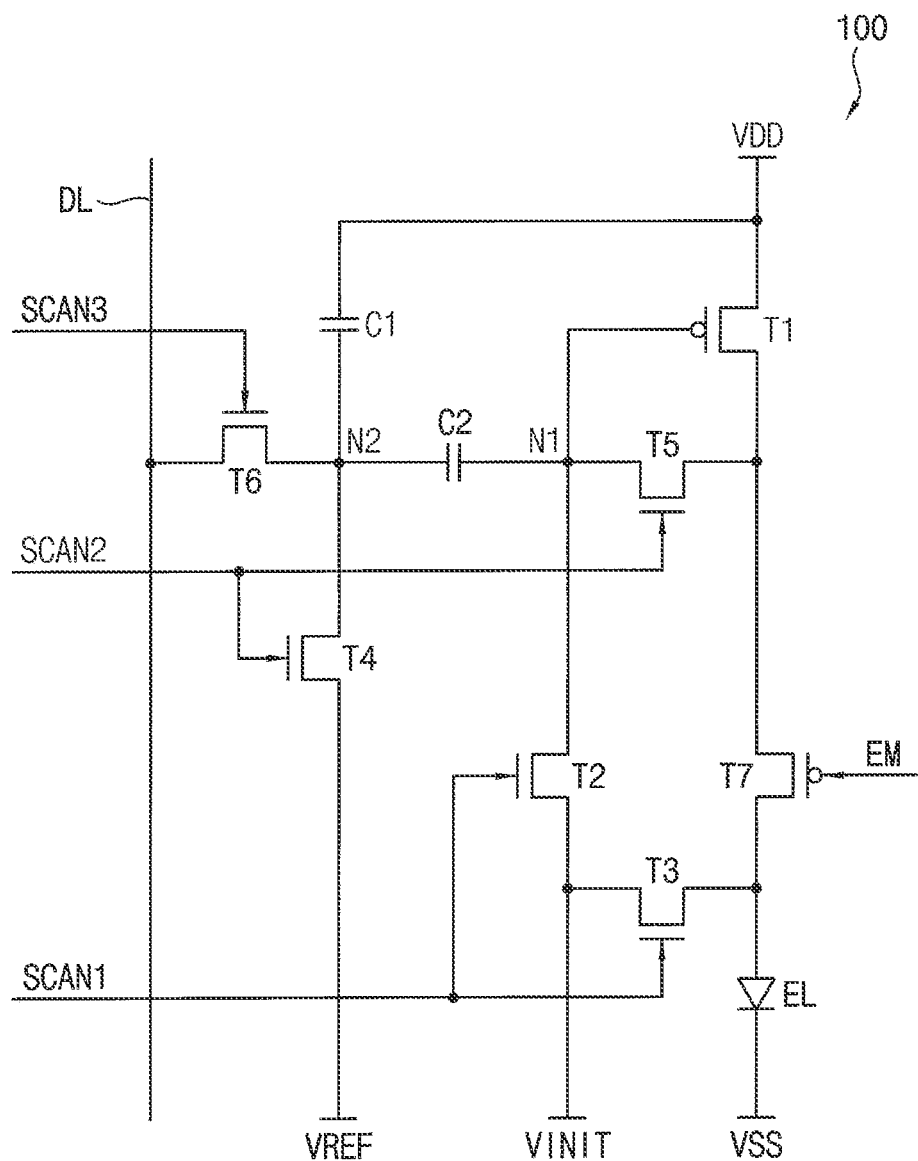
FIG. 1 is a circuit diagram illustrating a pixel of an organic light emitting diode (OLED) display device according to example embodiments.

FIG. 1 is a circuit diagram illustrating a pixel of an organic light emitting diode (OLED) display device according to example embodiments.

Referring to FIG. 1, a pixel 100 of an OLED display device according to example embodiments may include a first transistor T1, a second transistor T2, a third transistor T3, a fourth transistor T4, a fifth transistor T5, a sixth transistor T6, a seventh transistor T7, a first capacitor C1, a second capacitor C2 and an organic light emitting diode EL.

The first transistor T1 may generate a driving current based on a voltage of a first node N1, or a voltage of a second electrode of the first capacitor C1. For example, the first transistor T1 may be a driving transistor for generating the driving current. In some example embodiments, the first transistor T1 may include a gate electrode coupled to the first node N1, a first terminal coupled to a line of a first power supply voltage VDD (e.g., a high power supply voltage), and a second terminal.

The second transistor T2 may apply an initialization voltage VINIT to the first node N1 in response to a first scan signal SCAN1. In some example embodiments, the second transistor T2 may include a gate receiving the first scan signal SCAN1, a first terminal coupled to a line of the initialization voltage VINIT, and a second terminal coupled to the first node N1.

The third transistor T3 may apply the initialization voltage VINIT to an anode of the organic light emitting diode EL in response to the first scan signal SCAN1. In some example embodiments, the third transistor T3 may include a gate receiving the first scan signal SCAN1, a first terminal coupled to the line of the initialization voltage VINIT, and a second terminal coupled to the anode of the organic light emitting diode EL.

The fourth transistor T4 may apply a reference voltage VREF to a second node N2 in response to a second scan signal SCAN2. In some example embodiments, the fourth transistor T4 may include a gate receiving the second scan signal SCAN2, a first terminal coupled to a line of the reference voltage VREF, and a second terminal coupled to the second node N2.

The fifth transistor T5 may diode-connect the first transistor T1 in response to the second scan signal SCAN2. In some example embodiments, the fifth transistor T5 may include a gate receiving the second scan signal SCAN2, a first terminal coupled to the second terminal of the first transistor T1, and a second terminal coupled to the first node N1.

The sixth transistor T6 may transfer a data voltage of a data line DL to the second node N2 in response to a third scan signal SCAN3. In some example embodiments, the sixth transistor T6 may include a gate receiving the third scan signal SCAN3, a first terminal coupled to the data line DL, and a second terminal coupled to the second node N2. Further, in some example embodiments, the sixth transistor T6 may have a double gate structure including an upper gate and a lower gate. The sixth transistor T6 having the double gate structure may rapidly and efficiently transfer the data voltage.

The seventh transistor T7 may provide the driving current generated by the first transistor T1 to the organic light emitting diode EL in response to an emission signal EM. In some example embodiments, the seventh transistor T7 may include a gate receiving the emission signal EM, a first terminal coupled to the second terminal of the first transistor T1, and a second terminal coupled to the anode of the organic light emitting diode EL.

The first capacitor C1 may be coupled between the line of the first power supply voltage VDD and the second node N2. In some example embodiments, the first capacitor C1 may include a first electrode coupled to the line of the first power supply voltage VDD, and a second electrode coupled to the second node N2.

The second capacitor C2 may be coupled between the second node N2 and the first node N1. In some example embodiments, the second capacitor C2 may include a first electrode coupled to the second node N2, and a second electrode coupled to the first node N1. Further, in some example embodiments, the second capacitor C2 may have a high capacitance, and thus may stably store the data voltage. For example, a capacitance of the second capacitor C2 may be higher than a capacitance of the first capacitor C1, but the capacitances of the first and second capacitors C1 and C2 are not limited thereto.

The organic light emitting diode EL may emit light based on the driving current generated by the first transistor T1 while the seventh transistor T7 is turned on. In some example embodiments, the organic light emitting diode EL may include the anode coupled to the second terminal of the seventh transistor T7, and a cathode coupled to a line of a second power supply voltage VSS (e.g., a low power supply voltage).

An OLED display device supporting a low frequency driving technique may analyze input image data, and may change a driving frequency of a display panel according to an image corresponding to the input image data. For example, the OLED display device may drive the display panel at a normal driving frequency (e.g., about 240 Hz, about 120 Hz, etc.) or an input frame frequency of the input image data in a case where the input image data represent a moving image, and may drive the display panel at a low frequency lower than the normal driving frequency or the input frame frequency in a case where the input image data represent a still image. Thus, when displaying the still image, power consumption of the OLED display device may be reduced. However, when the driving frequency of the display panel is changed, even if the input image data represent the same gray level, luminance of the pixel or the display panel may be reduced (in particular, in a high gray level) by leakage currents of the transistors T1, T2, T3, T4, T5, T6, and T7 of the pixel, or leakage currents of the transistors T2, T4, T5, and T6 of which the terminals (e.g., sources and/or drains) is directly coupled to the first and second capacitors C1 and C2 as a time length of each frame period increases.

However, in the pixel 100 of the OLED display device according to example embodiments, as illustrated in FIG. 1, the first and seventh transistors T1, T2, T3, T4, T5, T6, and T7 may be implemented with PMOS transistors, and the second, third, fourth, fifth and sixth transistors T2, T3, T4, T5, and T6 may be implemented with NMOS transistors having relatively small leakage currents. In this case, since the transistors T2, T4, T5, and T6 of which the terminals (e.g., sources and/or drains) directly coupled to the first and second capacitors C1 and C2 are implemented with the NMOS transistors, the leakage currents of the transistors T2, T4, T5, and T6 from the first and second capacitors C1 and C2 may be reduced. Thus, even if the driving frequency of the display panel is changed, the pixel 100 or the display panel may display an image with substantially uniform luminance at the same gray level. Accordingly, the pixel 100 according to example embodiments may display an image with substantially uniform luminance in a wide driving frequency range (e.g., from about 10 Hz to about 240 Hz).

Figure 2:
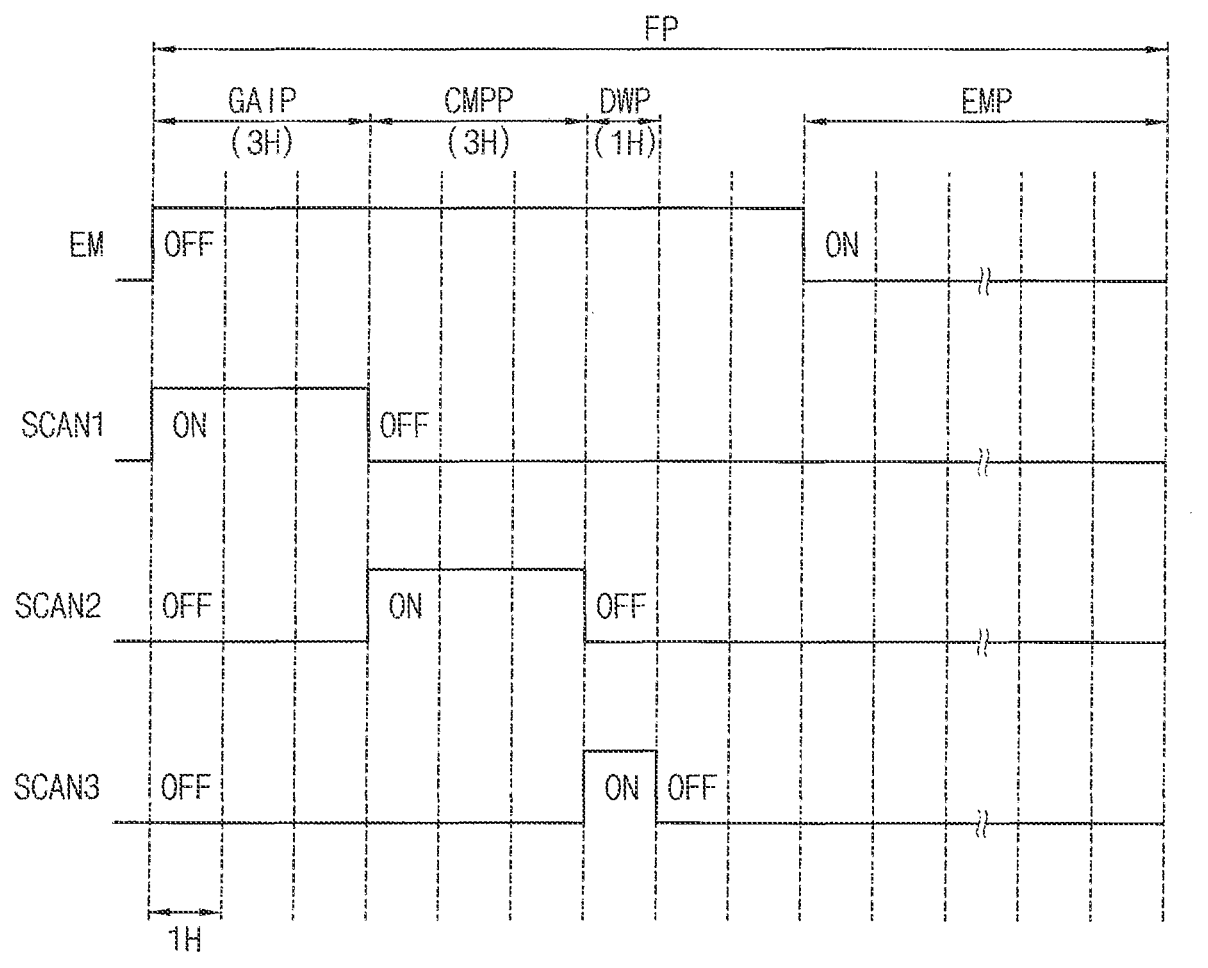
Figure 3:
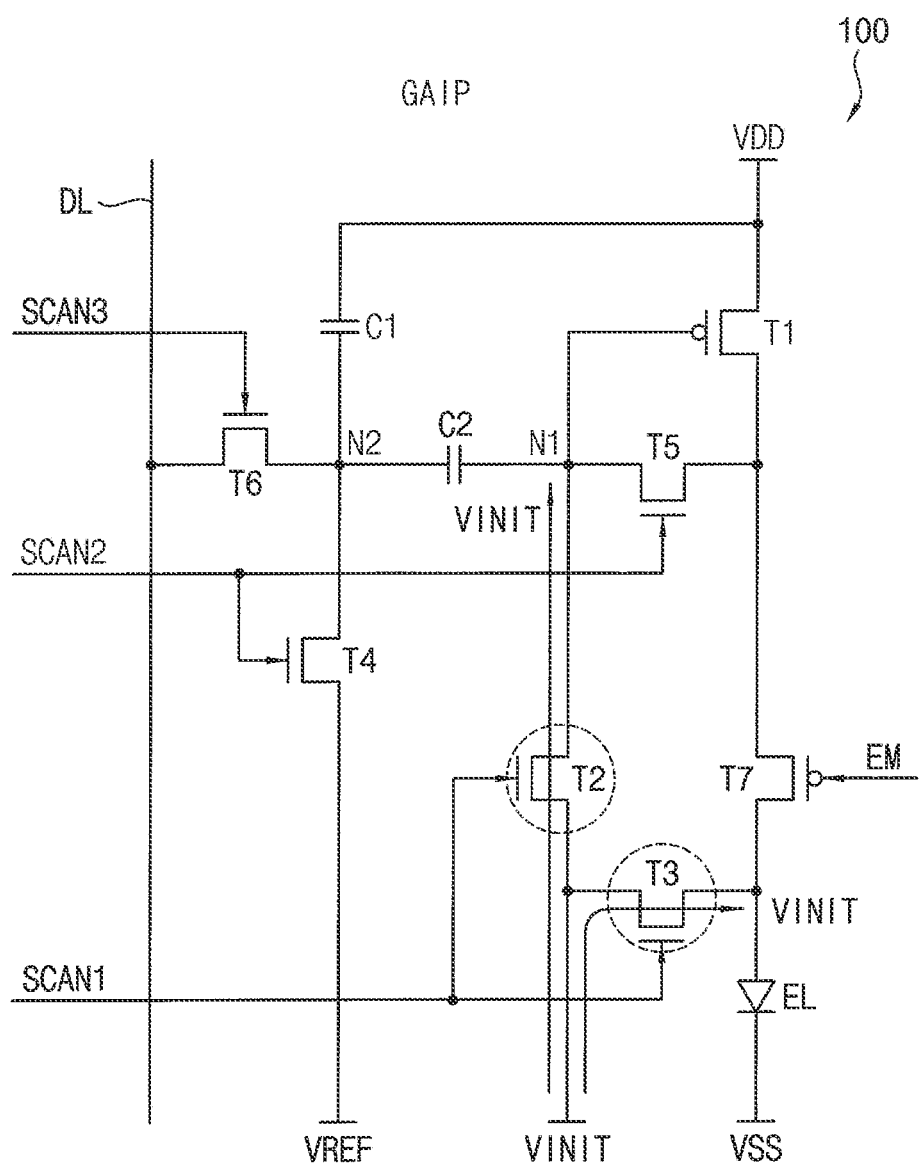
FIG. 3 is a circuit diagram for describing an example of an operation of a pixel in a gate and anode initialization period.
Figure 4:
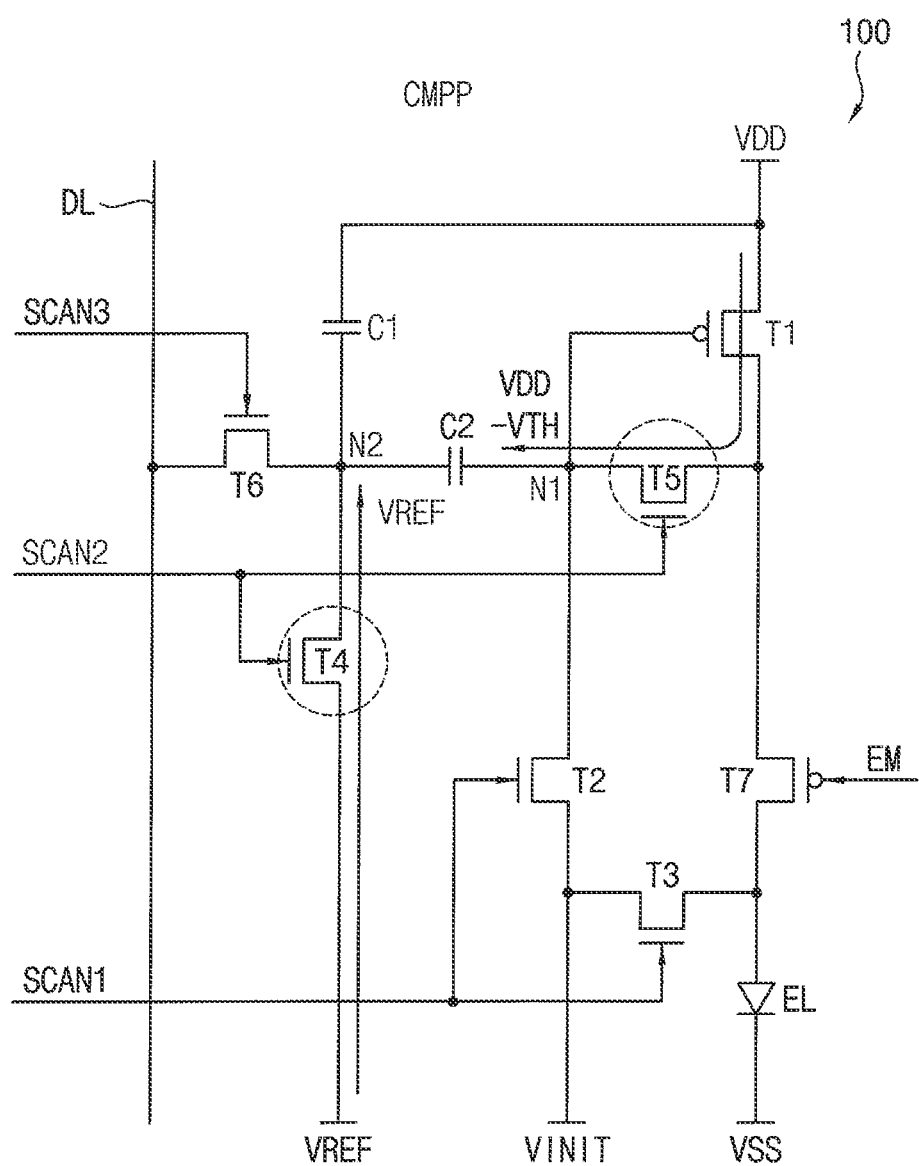
FIG. 4 is a circuit diagram for describing an example of an operation of a pixel in a threshold voltage compensation period.
Figure 5:
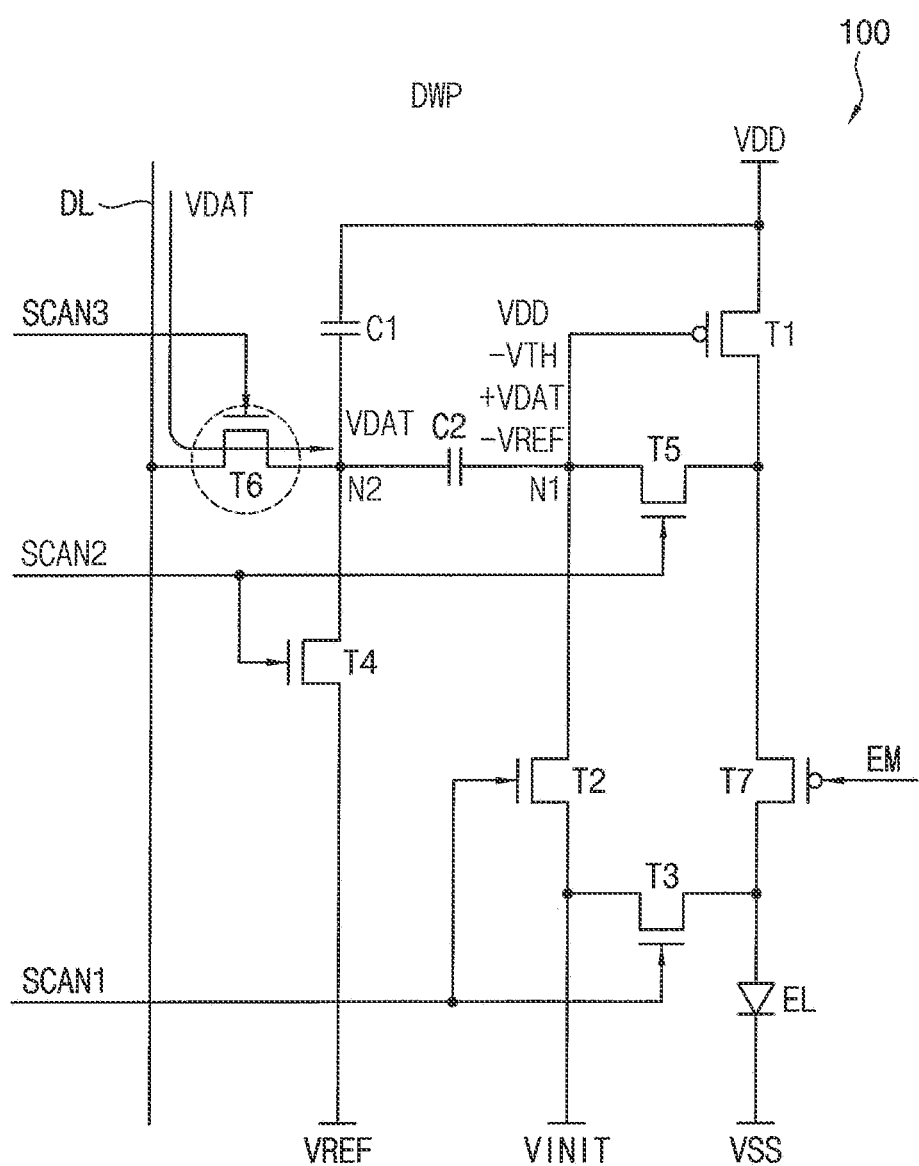
FIG. 5 is a circuit diagram for describing an example of an operation of a pixel in a data writing period.
Figure 6:
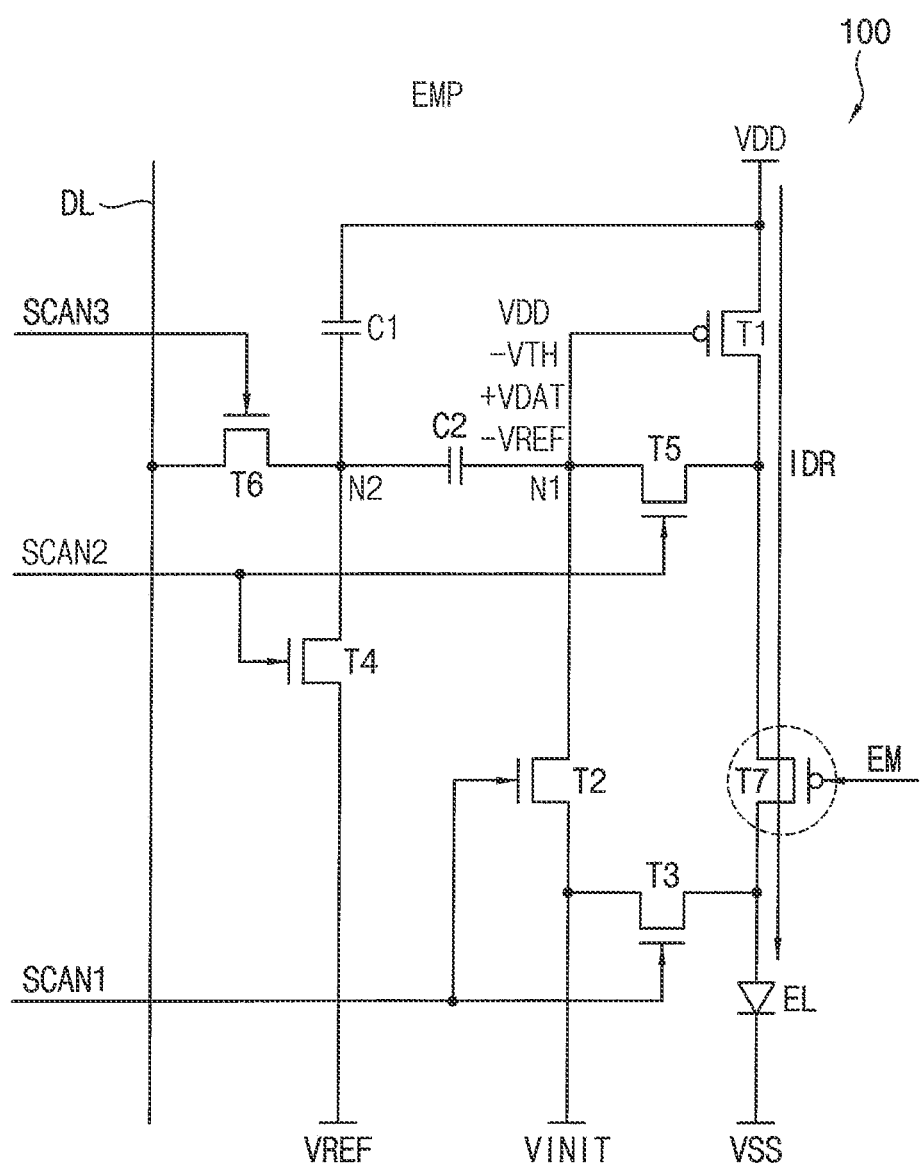
FIG. 6 is a circuit diagram for describing an example of an operation of a pixel in an emission period.

FIG. 2 is a timing diagram for describing an example of an operation of a pixel according to example embodiments, FIG. 3 is a circuit diagram for describing an example of an operation of a pixel in a gate and anode initialization period, FIG. 4 is a circuit diagram for describing an example of an operation of a pixel in a threshold voltage compensation period, FIG. 5 is a circuit diagram for describing an example of an operation of a pixel in a data writing period, and FIG. 6 is a circuit diagram for describing an example of an operation of a pixel in an emission period.

Referring to FIGS. 1 and 2, a frame period FP for a pixel 100 may include a gate and anode initialization period GAIP, a threshold voltage compensation period CMPP, a data writing period DWP, and an emission period EMP. In some example embodiments, as illustrated in FIGS. 1 and 2, an emission signal EM may be an active low signal having a low level as an on level and a high level as an off level, and first through third scan signals SCAN1, SCAN2, and SCAN3 may be active high signals having the high level as the on level and the low level as the off level. For example, the high level of the signals EM, SCAN1, SCAN2, and SCAN3 may be, but not limited to, about 8V, and the low level of the signals EM, SCAN1, SCAN2, and SCAN3 may be, but not limited to, about −6V.

In the gate and anode initialization period GAIP, a gate of a first transistor T1 and an anode of an organic light emitting diode EL may be initialized. In the gate and anode initialization period GAIP, the emission signal EM may have the off level, the first scan signal SCAN1 may have the on level, and the second and third scan signals SCAN2 and SCAN3 may have the off level. In some example embodiments, the emission signal EM may be changed to the off level, and then the first scan signal SCAN1 may be changed to the on level. In other example embodiments, the emission signal EM and the first scan signal SCAN1 may be substantially simultaneously changed to the off level and the on level. Further, in some example embodiments, the gate and anode initialization period GAIP may have a time length corresponding to, but not limited to, three horizontal times (or 3H time). Further, in some example embodiments, one horizontal time (or 1H time) of an OLED display device may be determined according to a maximum driving frequency (e.g., about 240 Hz) of a display panel. Here, one horizontal time may indicate a time allocated to process one row of pixels within a frame period.

In the gate and anode initialization period GAIP, as illustrated in FIG. 3, a seventh transistor T7 may be turned off in response to the emission signal EM having the off level, and second and third transistors T2 and T3 may be turned on in response to the first scan signal SCAN1 having the on level. Thus, the second transistor T2 may apply an initialization voltage VINIT to a first node N1, or the gate of the first transistor T1, and thus the gate of the first transistor T1 may be initialized. Further, the third transistor T3 may apply the initialization voltage VINIT to the anode of the organic light emitting diode EL, and thus the anode of the organic light emitting diode EL may be initialized. For example, the initialization voltage VINIT may be, but not limited to, about −1V.

In the threshold voltage compensation period CMPP, a threshold voltage of the first transistor T1 (e.g., a driving transistor) may be compensated. In the threshold voltage compensation period CMPP, the emission signal EM may have the off level, the second scan signal SCAN2 may have the on level, and the first and third scan signals SCAN1 and SCAN3 may have the off level. In some example embodiments, the first scan signal SCAN1 may be changed to the off level, and then the second scan signal SCAN2 may be changed to the on level. In other example embodiments, the first scan signal SCAN1 and the second scan signal SCAN2 may be substantially simultaneously changed to the off level and the on level. Further, in some example embodiments, the threshold voltage compensation period CMPP may have a time length corresponding to, but not limited to, three horizontal times (or 3H time). In some example embodiments, as illustrated in FIG. 2, the threshold voltage compensation period CMPP and the data writing period DWP may be separated from each other, and a time length (e.g., 3H time) of the threshold voltage compensation period CMPP may be longer than a time length (e.g., 1H time) of the data writing period DWP. In this case, since the threshold voltage compensation period CMPP has the time length longer than that of the data writing period DWP, the threshold voltage of the first transistor T1 (e.g., the driving transistor) may be sufficiently compensated.

In the threshold voltage compensation period CMPP, as illustrated in FIG. 4, fourth and fifth transistors T4 and T5 may be turned on in response to the second scan signal SCAN2 having the on level. Thus, the fourth transistor T4 may apply a reference voltage VREF to a second node N2, or a first electrode of a second capacitor C2. For example, the reference voltage VREF may be, but not limited to, about 2V. Further, the fifth transistor T5 may diode-connect the first transistor T1. Accordingly, a voltage VDD-VTH where the threshold voltage VTH is subtracted from a first power supply voltage VDD may be applied through the diode-connected first transistor T1 to the first node N1, or a second electrode of the second capacitor C2. For example, the first power supply voltage VDD may be, but not limited to, about 8V, and a second power supply voltage VSS may be, but not limited to, about −5V.

In the data writing period DWP, a data voltage of a data line DL may be applied to the second node N2, or the first electrode of the second capacitor C2. In the data writing period DWP, the emission signal EM may have the off level, the third scan signal SCAN3 may have the on level, and the first and second scan signals SCAN1 and SCAN2 may have the off level. In some example embodiments, the second scan signal SCAN2 may be changed to the off level, and then the third scan signal SCAN3 may be changed to the on level. In other example embodiments, the second scan signal SCAN2 and the third scan signal SCAN3 may be substantially simultaneously changed to the off level and the on level. Further, in some example embodiments, the data writing period DWP may have a time length corresponding to, but not limited to, one horizontal time (or 1H time).

In the data writing period DWP, as illustrated in FIG. 5, a sixth transistor T6 may be turned on in response to the third scan signal SCAN3 having the on level. Thus, the sixth transistor T6 may apply the data voltage VDAT to the second node N2, or the first electrode of the second capacitor C2. Accordingly, a voltage of the first electrode of the second capacitor C2 may be changed from the reference voltage VREF to the data voltage VDAT by a difference VDAT-VREF between the data voltage VDAT and the reference voltage VREF. If the voltage of the first electrode of the second capacitor C2 is changed by the difference VDAT-VREF between the data voltage VDAT and the reference voltage VREF, a voltage of the second electrode of the second capacitor C2 in a floating state also may be changed by the difference VDAT-VREF between the data voltage VDAT and the reference voltage VREF. Accordingly, in the data writing period DWP, the voltage of the second electrode of the second capacitor C2, or a voltage of the first node N1 may become a voltage VDD-VTH+VDAT-VREF where the difference VDAT-VREF between the data voltage VDAT and the reference voltage VREF is added to the voltage VDD-VTH where the threshold voltage VTH is subtracted from the first power supply voltage VDD.

In the emission period EMP, the organic light emitting diode EL may emit light. In the emission period EMP, the emission signal EM may have the on level, and the first, second and third scan signals SCAN1, SCAN2 and SCAN3 may have the off level. In some example embodiments, the third scan signal SCAN3 may be changed to the off level, and then the emission signal EM may be changed to the on level. In other example embodiments, the third scan signal SCAN3 and the emission signal EM may be substantially simultaneously changed to the off level and the on level.

In the emission period EMP, as illustrated in FIG. 6, the seventh transistor T7 may be turned on in response to the emission signal EM having the on level. Thus, the first transistor T1 may generate a driving current IDR based on the voltage VDD-VTH+VDAT-VREF of the first node N1, or the voltage VDD-VTH+VDAT-VREF of the second electrode of the second capacitor C2, the seventh transistor T7 may provide the driving current IDR to the organic light emitting diode EL, and the organic light emitting diode EL may emit light based on the driving current IDR. The driving current IDR generated by the first transistor T1 may be determined according to an equation, "$\beta/2*(VSG-VTH)^2$". Here, $\beta$ may be a transistor gain determined by a mobility, a capacitance, a width and a length of the first transistor T1, VSG may be a source-gate voltage of the first transistor T1, and VTH may be the threshold voltage of the first transistor T1. Further, since a source voltage of the first transistor T1 is the first power supply voltage VDD, and a gate voltage of the first transistor T1 is the voltage of the first node N1, or "VDD-VTH+VDAT-VREF", "VSG-VTH" may be "VDD-VDD+VTH-VDAT+VREF-VTH=VREF-VDAT". Thus, the driving current IDR may be determined based on the reference data VREF and the data voltage VDAT regardless of the threshold voltage VTH of the first transistor T1.

Figure 7:
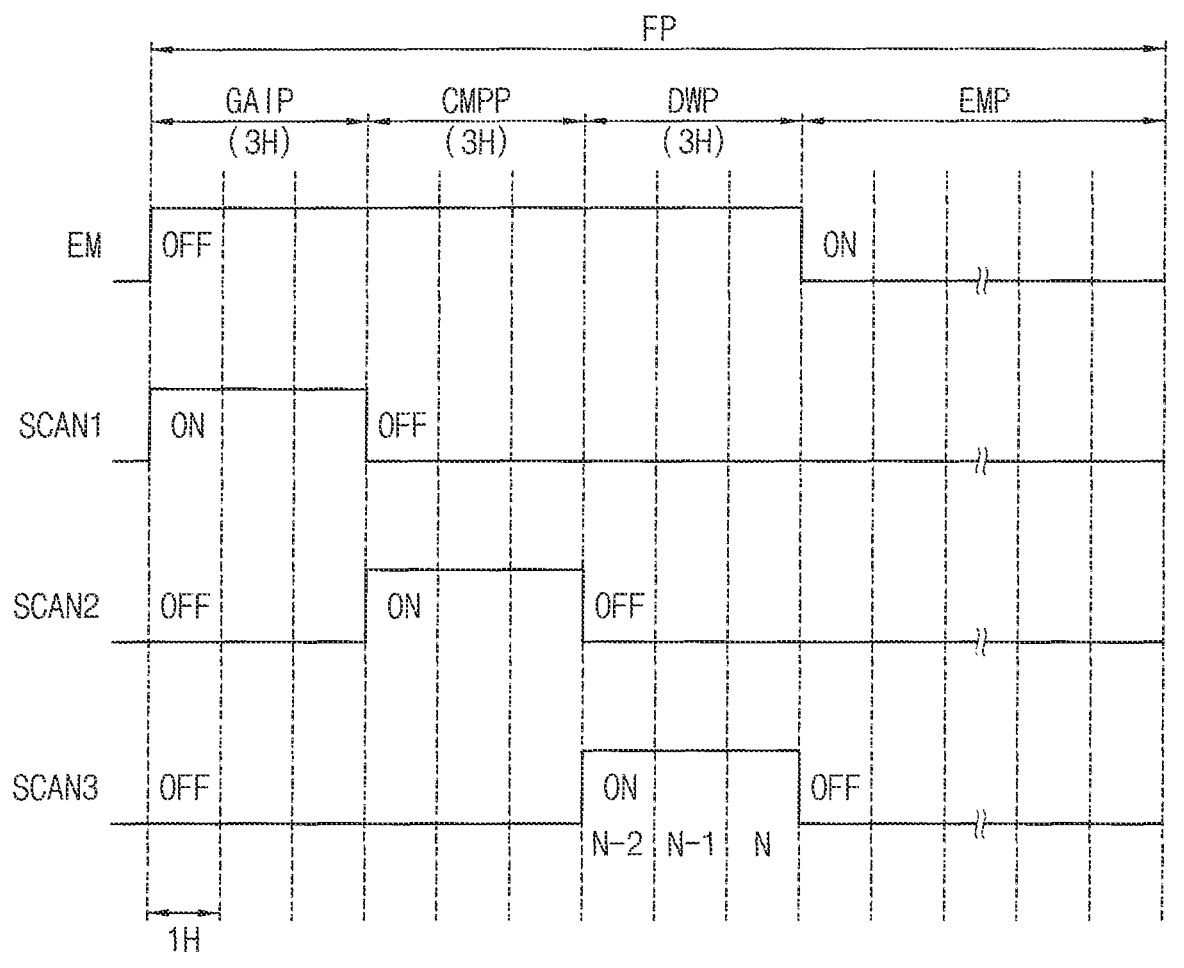

FIG. 7 is a timing diagram for describing another example of an operation of a pixel according to example embodiments.

Referring to FIGS. 1, 2, 3, 4, 5, 6, and 7, a frame period FP for a pixel 100 may include a gate and anode initialization period GAIP, a threshold voltage compensation period CMPP, a data writing period DWP, and an emission period EMP. The frame period FP illustrated in FIG. 7 may be substantially the same as a frame period FP illustrated in FIG. 2, except that the time length of the data writing period DWP increase from one horizontal time (1H time) to three horizontal times (3H time).

In some example embodiments, as illustrated in FIG. 7, the gate and anode initialization period GAIP, the threshold voltage compensation period CMPP and the data writing period DWP may have the same time length, for example three horizontal times (3H time). FIG. 7 illustrates examples of an emission signal EM and first through third scan signals SCAN1, SCAN2 and SCAN3 for the pixel 100 in an N-th row, where N is an integer greater than 2. A first data voltage may be written to a pixel 100 in an (N−2)-th row in a first 1H time of the data writing period DWP, a second data voltage may be written to a pixel 100 in an (N−1)-th row in a second 1H time of the data writing period DWP, and a third data voltage may be written to the pixel 100 in the N-th row in a third 1H time of the data writing period DWP. In this case, since, before the third data voltage is written to the pixel 100 in the N-th row, the first and second data voltages for the pixels 100 in the (N−2)-th and (N−1)-th rows are provided, a pre-charge operation for the pixel 100 in the N-th row may be performed.

Figure 8:
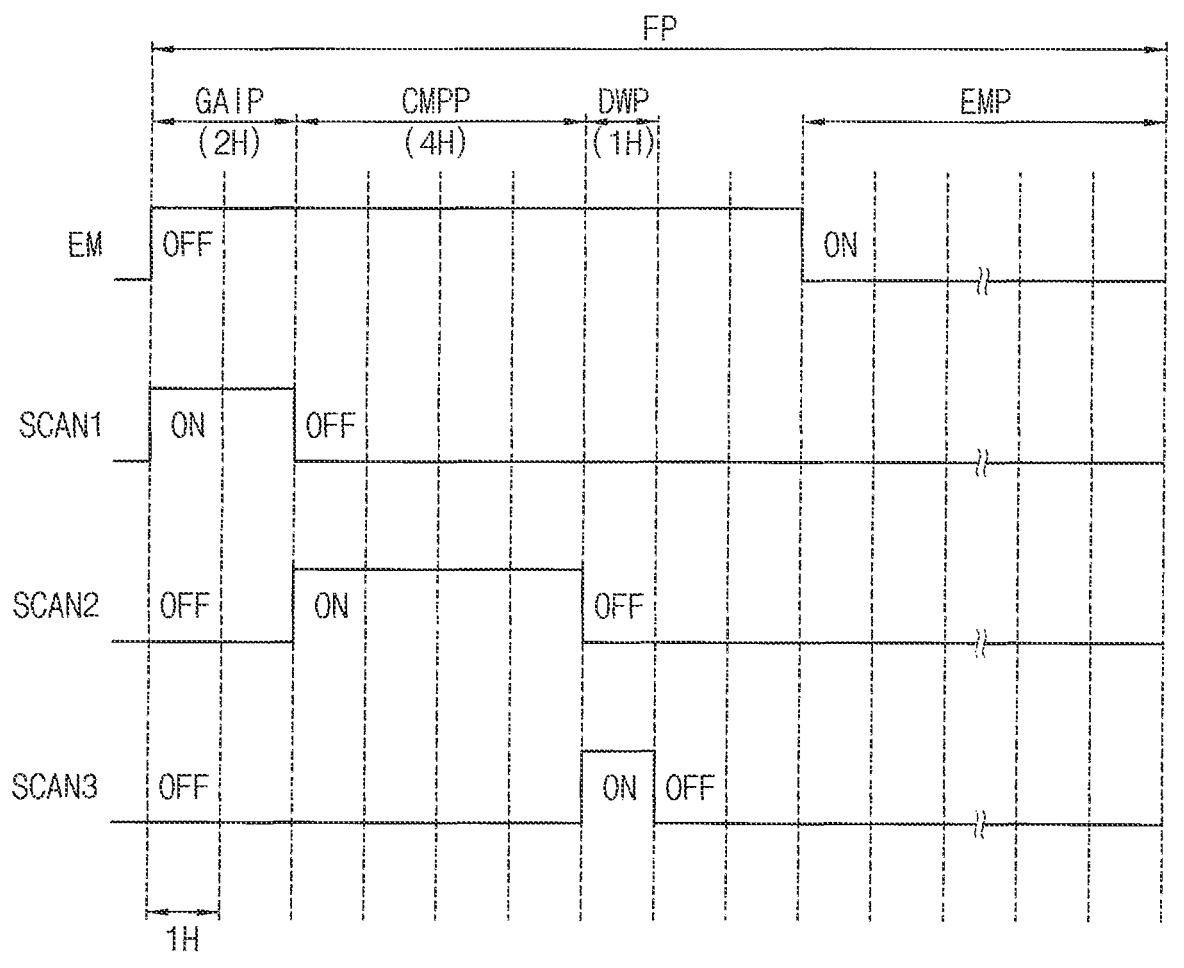

FIG. 8 is a timing diagram for describing still another example of an operation of a pixel according to example embodiments.

Referring to FIGS. 1, 2, 3, 4, 5, 6, 7, and 8, a frame period FP for a pixel 100 may include a gate and anode initialization period GAIP, a threshold voltage compensation period CMPP, a data writing period DWP, and an emission period EMP. The frame period FP illustrated in FIG. 8 may be substantially the same as a frame period FP illustrated in FIG. 2, except that the time length of the gate and anode initialization period GAIP deceases, and the time length of the threshold voltage compensation period CMPP increase.

In some example embodiments, compared with the frame period FP illustrated in FIG. 2, the gate and anode initialization period GAIP illustrated in FIG. 8 may decrease from three horizontal times (3H time) to two horizontal times (2H time), and the threshold voltage compensation period CMPP may increase from three horizontal times (3H time) to four horizontal times (4H time). In this case, a time length of the threshold voltage compensation period CMPP may increase while maintaining a time length of the emission period EMP, and thus a threshold voltage of a first transistor T1 (e.g., a driving transistor) may be more sufficiently compensated.

Figure 9:
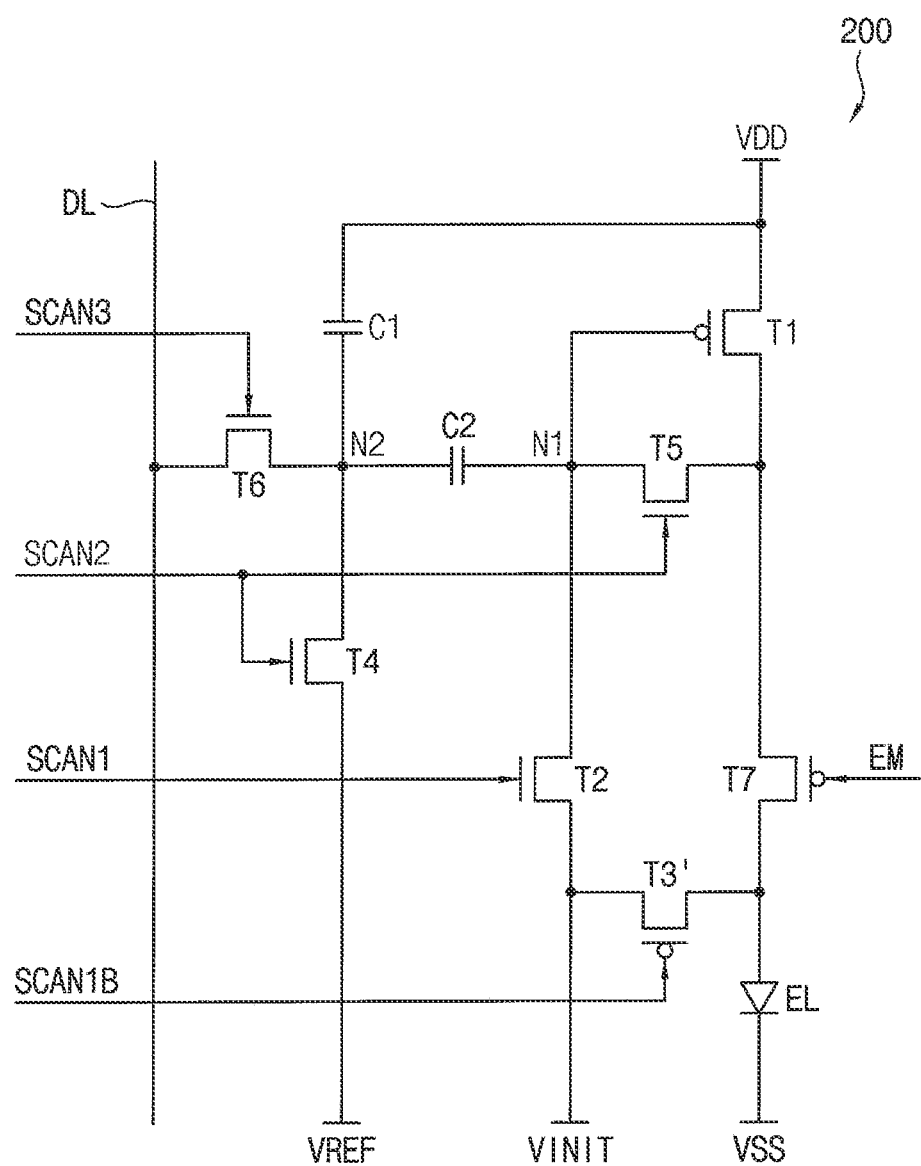
FIG. 9 is a circuit diagram illustrating a pixel of an OLED display device according to example embodiments.
Figure 10:
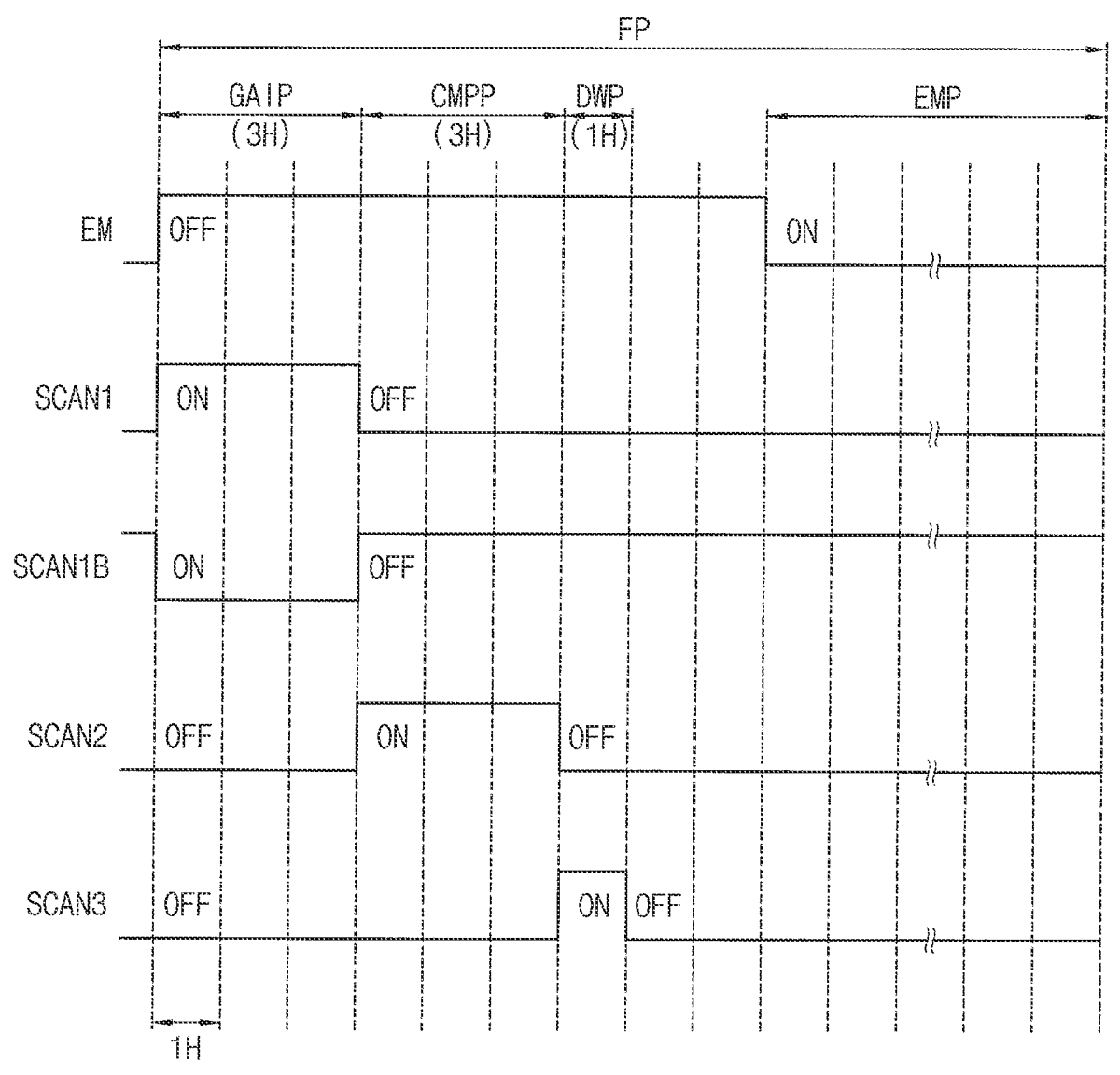

FIG. 9 is a circuit diagram illustrating a pixel of an OLED display device according to example embodiments, and FIG. 10 is a timing diagram for describing an example of an operation of a pixel according to example embodiments.

Referring to FIGS. 9 and 10, a pixel 200 of an OLED display device according to example embodiments may include a first transistor T1, a second transistor T2, a third transistor T3', a fourth transistor T4, a fifth transistor T5, a sixth transistor T6, a seventh transistor T7, a first capacitor C1, a second capacitor C2 and an organic light emitting diode EL. The pixel 200 of FIG. 9 may have substantially the same configuration as a pixel 100 of FIG. 1, except that the third transistor T3' is implemented with a PMOS transistor, and the third transistor T3' may receive not a first scan signal SCAN1 but a fourth scan signal SCAN1B. Further, signals EM, SCAN1, SCAN1B, SCAN2 and SCAN3 provided to the pixel 200 illustrated in FIG. 10 may be substantially the same as signals EM, SCAN1, SCAN2 and SCAN3 provided to the pixel 100 illustrated in FIG. 2, except that the pixel 200 further receives the fourth scan signal SCAN1B. That is, during the GAIP period, the fourth scan signal SCAN1B has on level, and during the CMPP, DWP, and EMP periods, the fourth scan signal SCAN1B has off level.

The third transistor T3' may apply an initialization voltage VINIT to an anode of the organic light emitting diode EL in response to the fourth scan signal SCAN1B. In some example embodiments, the third transistor T3' may include a gate receiving the fourth scan signal SCAN1B, a first terminal coupled to a line of the initialization voltage VINIT, and a second terminal coupled to the anode of the organic light emitting diode EL. Further, in some example embodiments, as illustrated in FIGS. 9 and 10, the third transistor T3' may be a PMOS transistor, and the fourth scan signal SCAN1B may be an inverted version of the first scan signal SCAN1. Accordingly, the third transistor T3' may be turned on while the second transistor T2 is turned on.

As illustrated in FIG. 9, the first, third and seventh transistors T1, T3' and T7 may be implemented with PMOS transistors, and the second, fourth, fifth and sixth transistors T2, T4, T5 and T6 may be implemented with NMOS transistors having relatively small leakage currents. In this case, since the transistors T2, T4, T5 and T6 of which terminals (e.g., sources and/or drains) directly coupled to the first and second capacitors C1 and C2 are implemented with the NMOS transistors, the leakage currents of the transistors T2, T4, T5 and T6 from the first and second capacitors C1 and C2 may be reduced. Thus, even if a driving frequency of a display panel is changed, the pixel 200 or the display panel may display an image with substantially uniform luminance at the same gray level. Accordingly, the pixel 200 according to example embodiments may display an image with substantially uniform luminance in a wide driving frequency range (e.g., from about 10 Hz to about 240 Hz).

Figure 11:
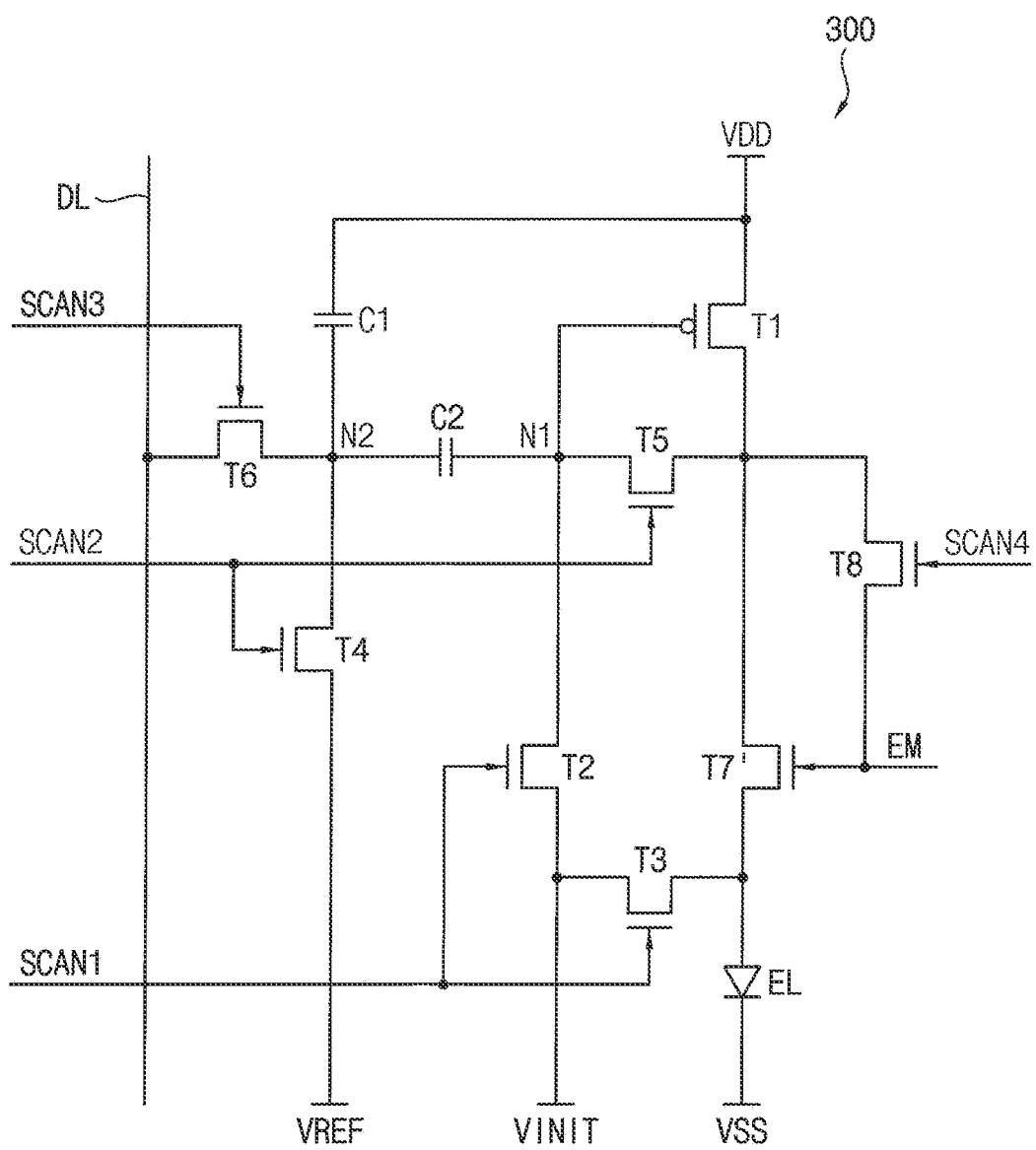
FIG. 11 is a circuit diagram illustrating a pixel of an OLED display device according to example embodiments.
Figure 12:
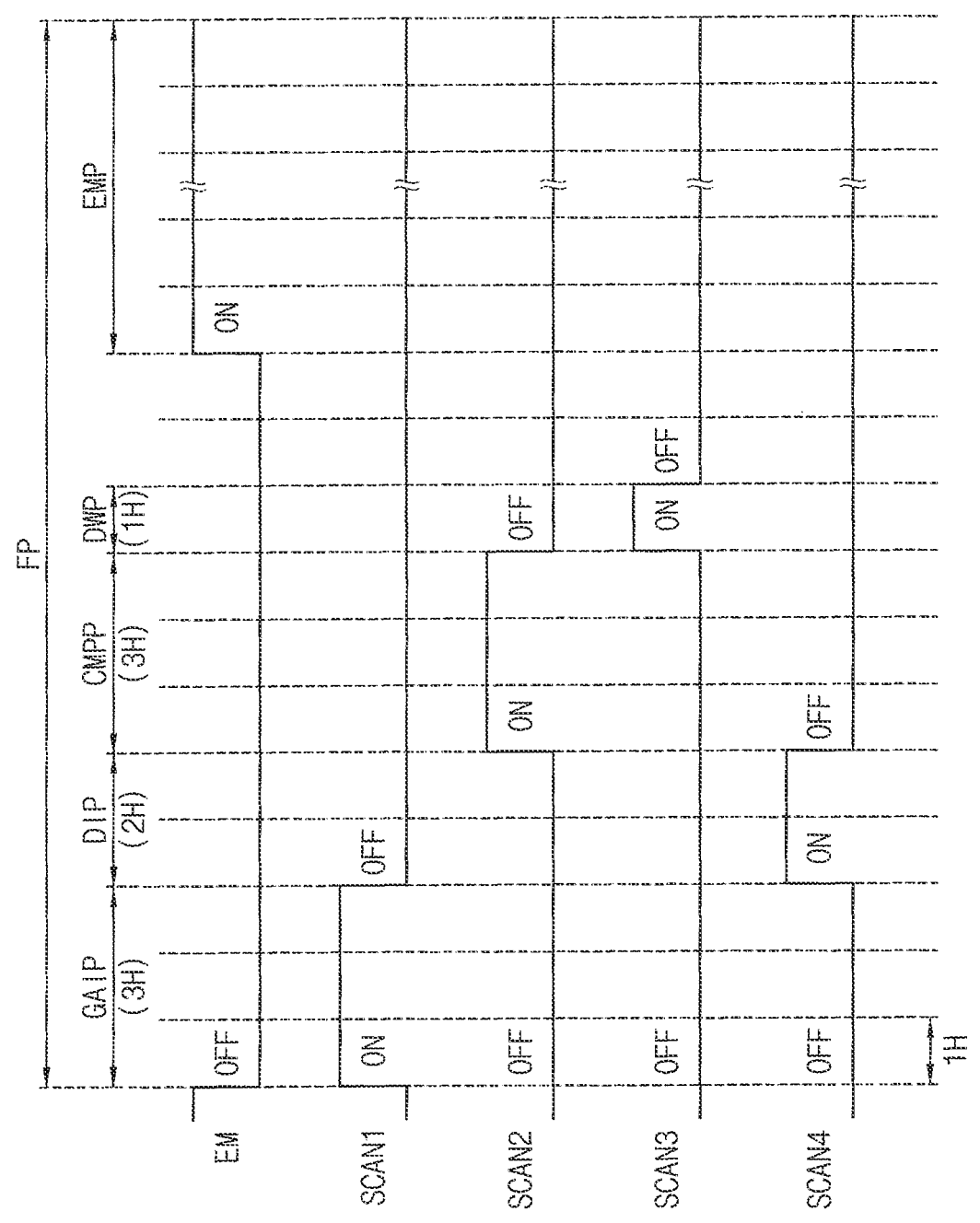
Figure 13:
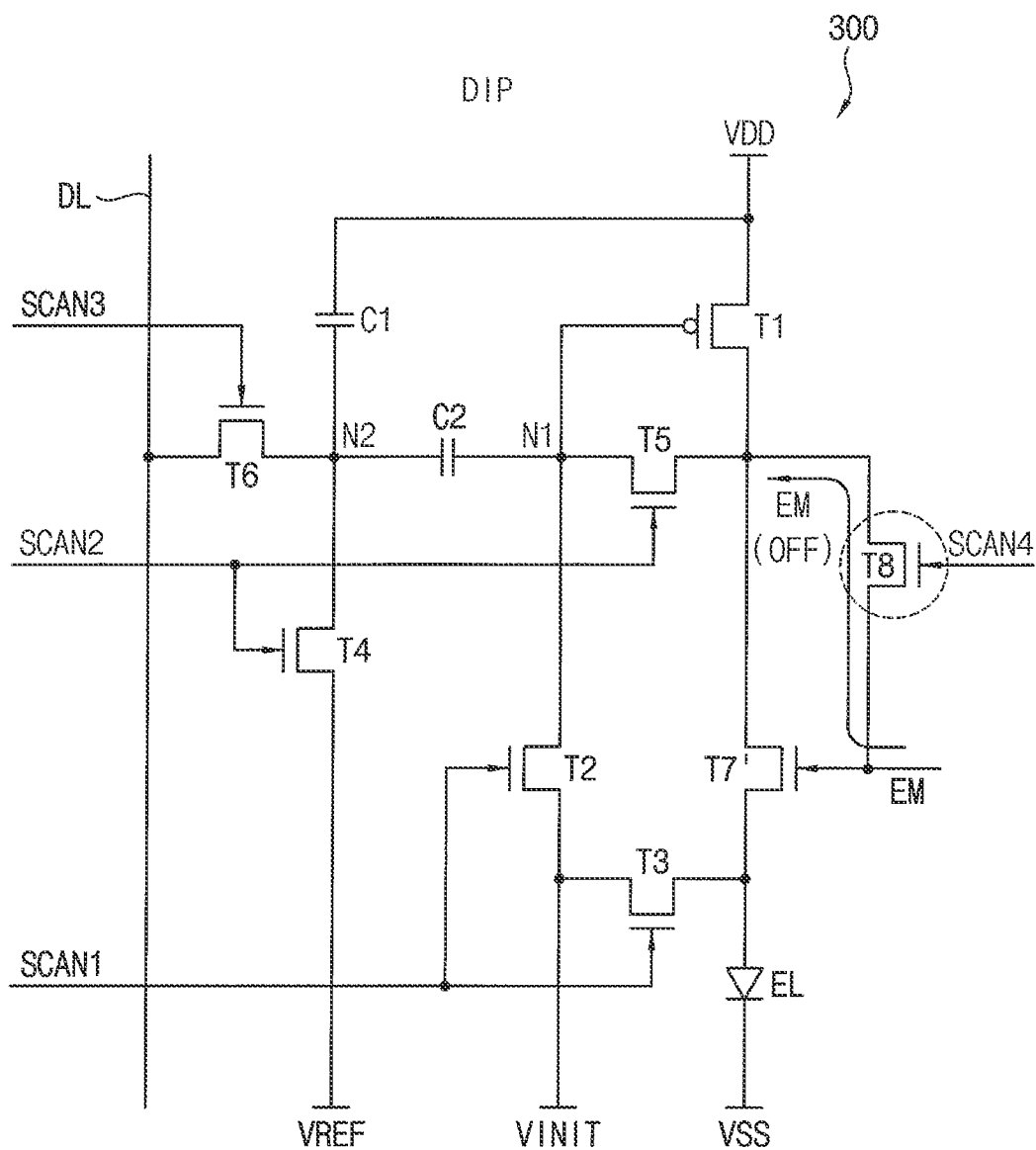
FIG. 13 is a circuit diagram for describing an example of an operation of a pixel in a drain initialization period.

FIG. 11 is a circuit diagram illustrating a pixel of an OLED display device according to example embodiments, FIG. 12 is a timing diagram for describing an example of an operation of a pixel according to example embodiments, and FIG. 13 is a circuit diagram for describing an example of an operation of a pixel in a drain initialization period.

Referring to FIGS. 11 and 12, a pixel 300 of an OLED display device according to example embodiments may include a first transistor T1, a second transistor T2, a third transistor T3, a fourth transistor T4, a fifth transistor T5, a sixth transistor T6, a seventh transistor T7', an eighth transistor T8, a first capacitor C1, a second capacitor C2 and an organic light emitting diode EL. The pixel 300 of FIG. 11 may have substantially the same configuration as a pixel 100 of FIG. 1, except that the seventh transistor T7' is implemented with an NMOS transistor, and the pixel 300 further includes the eighth transistor T8. Further, signals EM, SCAN1, SCAN2, SCAN3 and SCAN4 provided to the pixel 300 illustrated in FIG. 12 may be substantially the same as signals EM, SCAN1, SCAN2 and SCAN3 provided to the pixel 100 illustrated in FIG. 2, except that the pixel 300 further receives a fourth scan signal SCAN4. Further, a frame period FP illustrated in FIG. 12 may be substantially the same as a frame period FP illustrated in FIG. 2, except that the frame period FP of FIG. 12 further includes a drain initialization period DIP.

The seventh transistor T7' may provide a driving current generated by the first transistor T1 to the organic light emitting diode EL in response to an emission signal EM. In some example embodiments, the seventh transistor T7' may be the NMOS transistor, and the emission signal EM may be an active high signal having a high level as an on level and a low level as an off level OFF. For example, the high level, or the on level of the emission signal EM may be, but not limited to, about 8V, and the low level, or the off level OFF of the emission signal EM may be, but not limited to, about −6V.

The eighth transistor T8 may apply the emission signal EM having the off level OFF (e.g., the low level) to a second terminal, or a drain of the first transistor T1 in response to the fourth scan signal SCAN4. In some example embodiments, the eighth transistor T8 may include a gate receiving the fourth scan signal SCAN4, a first terminal receiving the emission signal EM, and a second terminal coupled to the second terminal of the first transistor T1. Further, in some example embodiments, the eighth transistor T8 may have, but not limited to, a double gate structure including an upper gate and a lower gate.

As illustrated in FIG. 11, the first transistor T1 may be implemented with a PMOS transistor, and the second through eighth transistors T2, T3, T4, T5, T6, T7' and T8 may be implemented with NMOS transistors having relatively small leakage currents. In this case, since the transistors T2, T3, T4, T5, T6, T7' and T8 of which terminals (e.g., sources and/or drains) directly or indirectly coupled to the first and second capacitors C1 and C2 are implemented with the NMOS transistors, the leakage currents of the transistors T2, T3, T4, T5, T6, T7' and T8 from the first and second capacitors C1 and C2 may be reduced. Thus, even if a driving frequency of a display panel is changed, the pixel 300 or the display panel may display an image with substantially uniform luminance at the same gray level. Accordingly, the pixel 300 according to example embodiments may display an image with substantially uniform luminance in a wide driving frequency range (e.g., from about 10 Hz to about 240 Hz).

Further, as illustrated in FIG. 12, the frame period FP for the pixel 300 may include a gate and anode initialization period GAIP, the drain initialization period DIP, a threshold voltage compensation period CMPP, a data writing period DWP, and an emission period EMP. In some example embodiments, the drain initialization period DIP may not overlap the threshold voltage compensation period CMPP. For example, as illustrated in FIG. 12, the drain initialization period DIP may be located between the gate and anode initialization period GAIP and the threshold voltage compensation period CMPP, and may not be overlapped with the gate and anode initialization period GAIP and the threshold voltage compensation period CMPP In the drain initialization period DIP, the second terminal, or the drain of the first transistor T1 may be initialized. In the drain initialization period DIP, the emission signal EM may have the off level OFF, the fourth scan signal SCAN4 may have the on level, and first, second and third scan signals SCAN1, SCAN2 and SCAN3 may have the off level. In some example embodiments, the first scan signal SCAN1 may be changed to the off level, and then the fourth scan signal SCAN4 may be changed to the on level. In other example embodiments, the first scan signal SCAN1 and the fourth scan signal SCAN4 may be substantially simultaneously changed to the off level and the on level. Further, in some example embodiments, the drain initialization period DIP may have a time length corresponding to, but not limited to, two horizontal times (or 2H time).

In the drain initialization period DIP, as illustrated in FIG. 13, the eighth transistor T8 may be turned on in response to the fourth scan signal SCAN4 having the on level (e.g., the high level). Thus, the eighth transistor T8 may apply the emission signal EM having the off level OFF (e.g., the low level) to the second terminal, or the drain of the first transistor T1, and thus the drain of the first transistor T1 may be initialized. For example, the emission signal EM having the off level OFF may be, but not limited to, about −6V.

Figure 14:
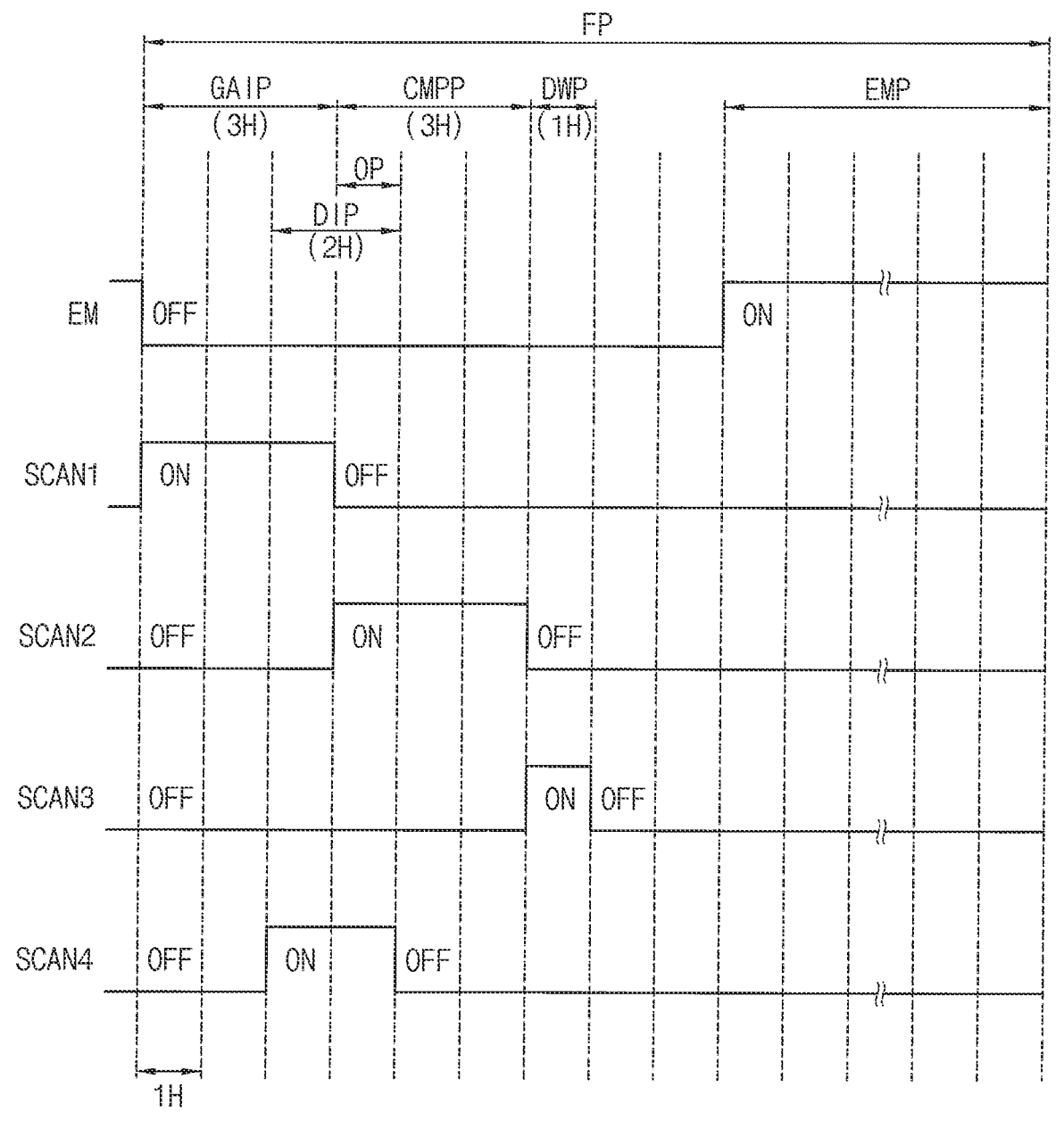
Figure 15:
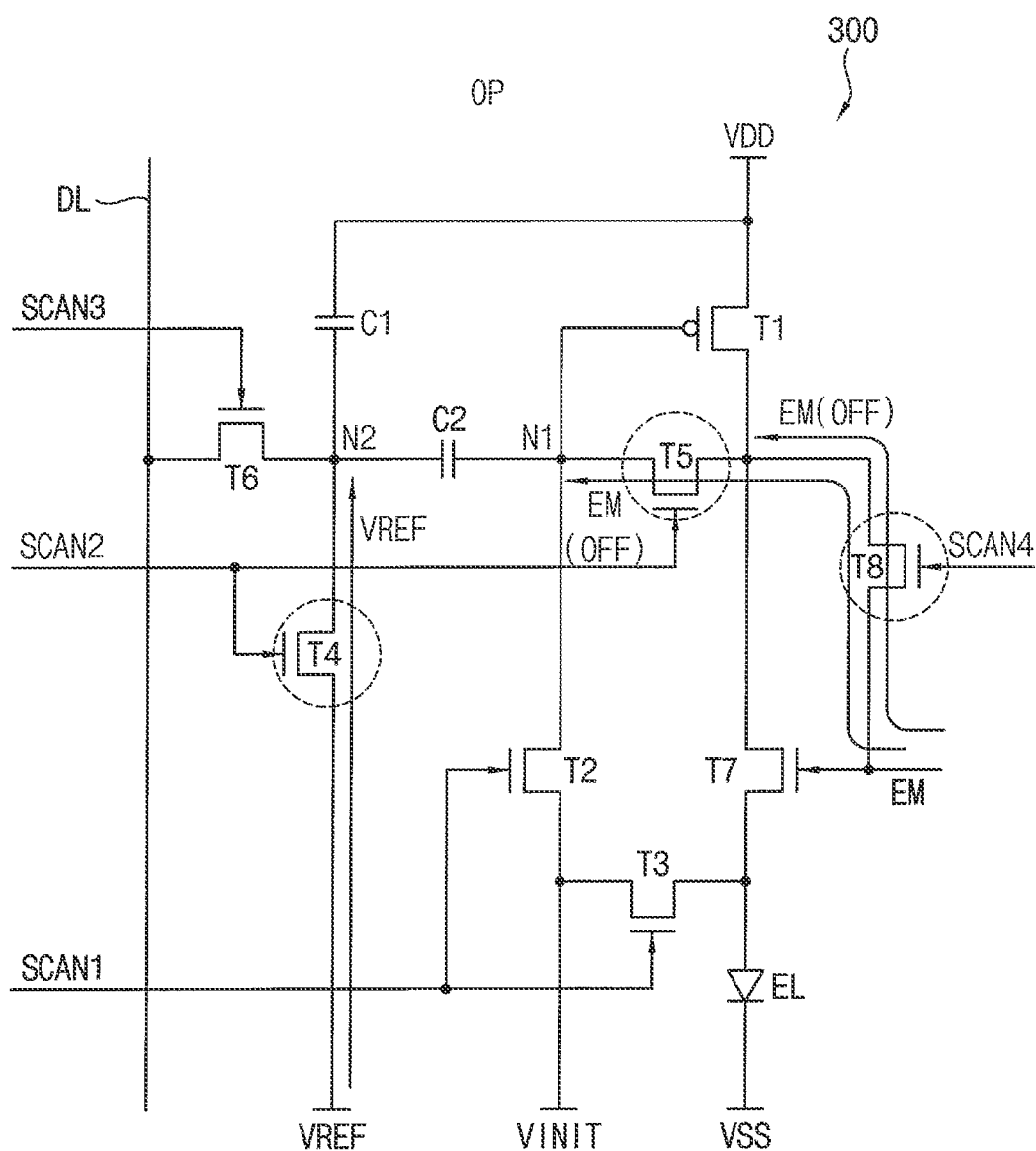
FIG. 15 is a circuit diagram for describing an example of an operation of a pixel in a period where a drain initialization period and a threshold voltage compensation period overlap each other.

FIG. 14 is a timing diagram for describing another example of an operation of a pixel according to example embodiments, and FIG. 15 is a circuit diagram for describing an example of an operation of a pixel in a period where a drain initialization period and a threshold voltage compensation period overlap each other.

Referring to FIGS. 11, 12, 13, and 14, a frame period FP for a pixel 300 may include a gate and anode initialization period GAIP, a drain initialization period DIP, a threshold voltage compensation period CMPP, a data writing period DWP, and an emission period EMP. In some example embodiments, the drain initialization period DIP may partially overlap the threshold voltage compensation period CMPP. For example, as illustrated in FIG. 14, the drain initialization period DIP may have the time length corresponding to two horizontal times (or 2H time), a first 1H time of the drain initialization period DIP may overlap the gate and anode initialization period GAIP, and a second 1H time of the drain initialization period DIP may overlap the threshold voltage compensation period CMPP.

In the gate and anode initialization period GAIP, a gate of a first transistor T1 and an anode of an organic light emitting diode EL may be initialized. In the drain initialization period DIP, a second terminal, or a drain of the first transistor T1 may be initialized by an emission signal EM having an off level OFF (e.g., a low level). Further, in a period OP where the drain initialization period DIP and the threshold voltage compensation period CMPP overlap each other, the emission signal may have the off level, second and fourth scan signals SCAN2 and SCAN4 may have an on level, and first and third scan signals SCAN1 and SCAN3 may have the off level. In this case, as illustrated in FIG. 15, fourth and fifth transistors T4 and T5 may be turned on in response to the second scan signal SCAN2 having the on level, and an eighth transistor T8 may be turned on in response to the fourth scan signal SCAN4 having the on level. The eighth transistor T8 may apply the emission signal EM having the off level OFF (e.g., the low level) to the second terminal, or the drain of the first transistor T1, and thus the drain of the first transistor T1 may be initialized. Further, the emission signal EM having the off level OFF may be applied through the eighth transistor T8 and the fifth transistor T5 to a first node N1, or the gate of the first transistor T1, and thus the gate of the first transistor T1 may be initialized by the emission signal EM having the off level OFF. Thus, the gate of the first transistor T1 may be initialized by an initialization voltage VINIT in the gate and anode initialization period GAIP, and then may be further initialized by the emission signal EM having the off level OFF in the period OP where the drain initialization period DIP and the threshold voltage compensation period CMPP overlap each other. Further, since the anode of the organic light emitting diode EL is initialized by the initialization voltage VINIT, and the gate of the first transistor T1 is initialized not only by the initialization voltage VINIT but also by the emission signal EM having the off level OFF, voltages for initializing the anode of the organic light emitting diode EL and the gate of the first transistor T1 may be separated from each other.

Figure 16:
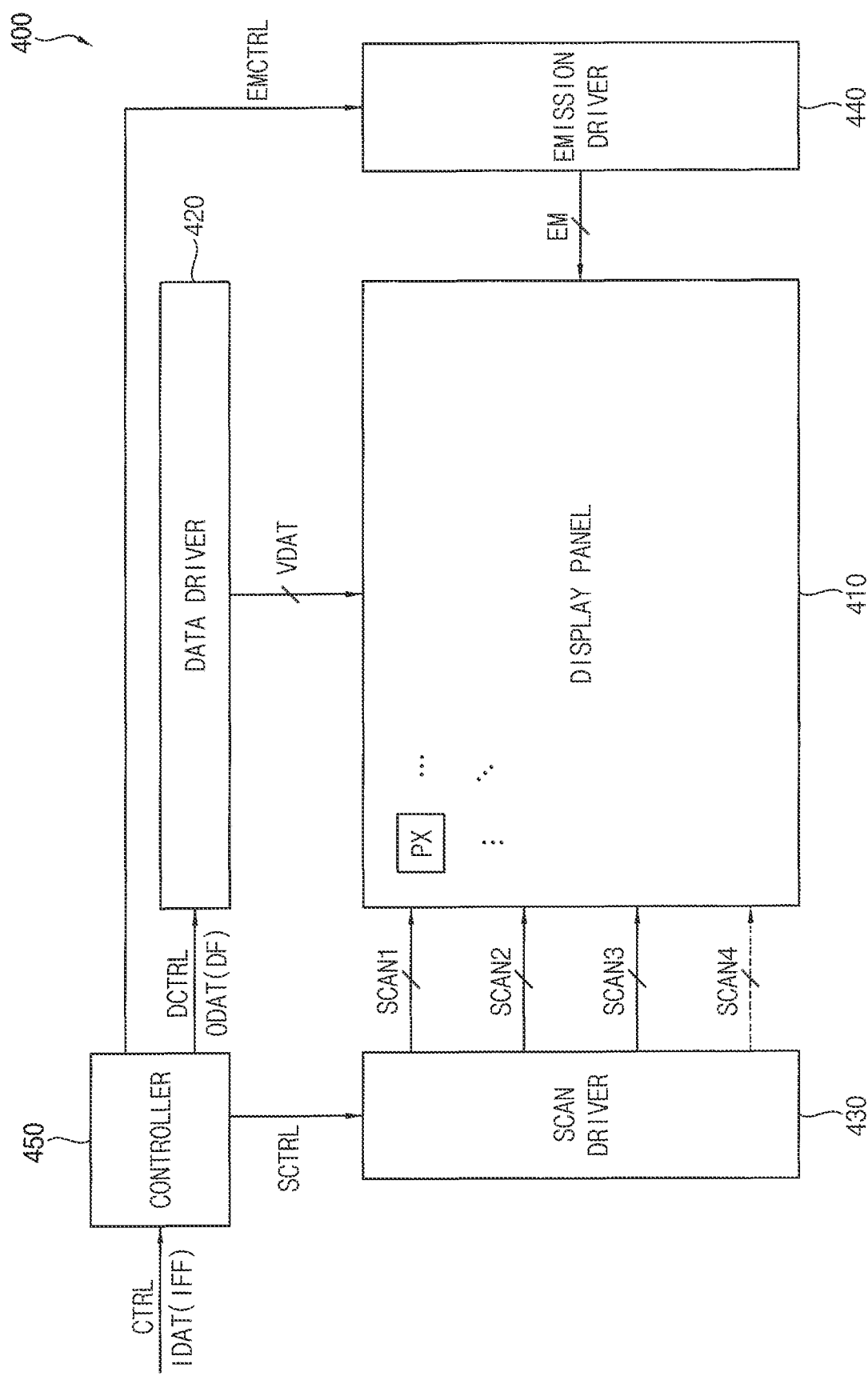
FIG. 16 is a block diagram illustrating an OLED display device according to example embodiments.
Figure 17:
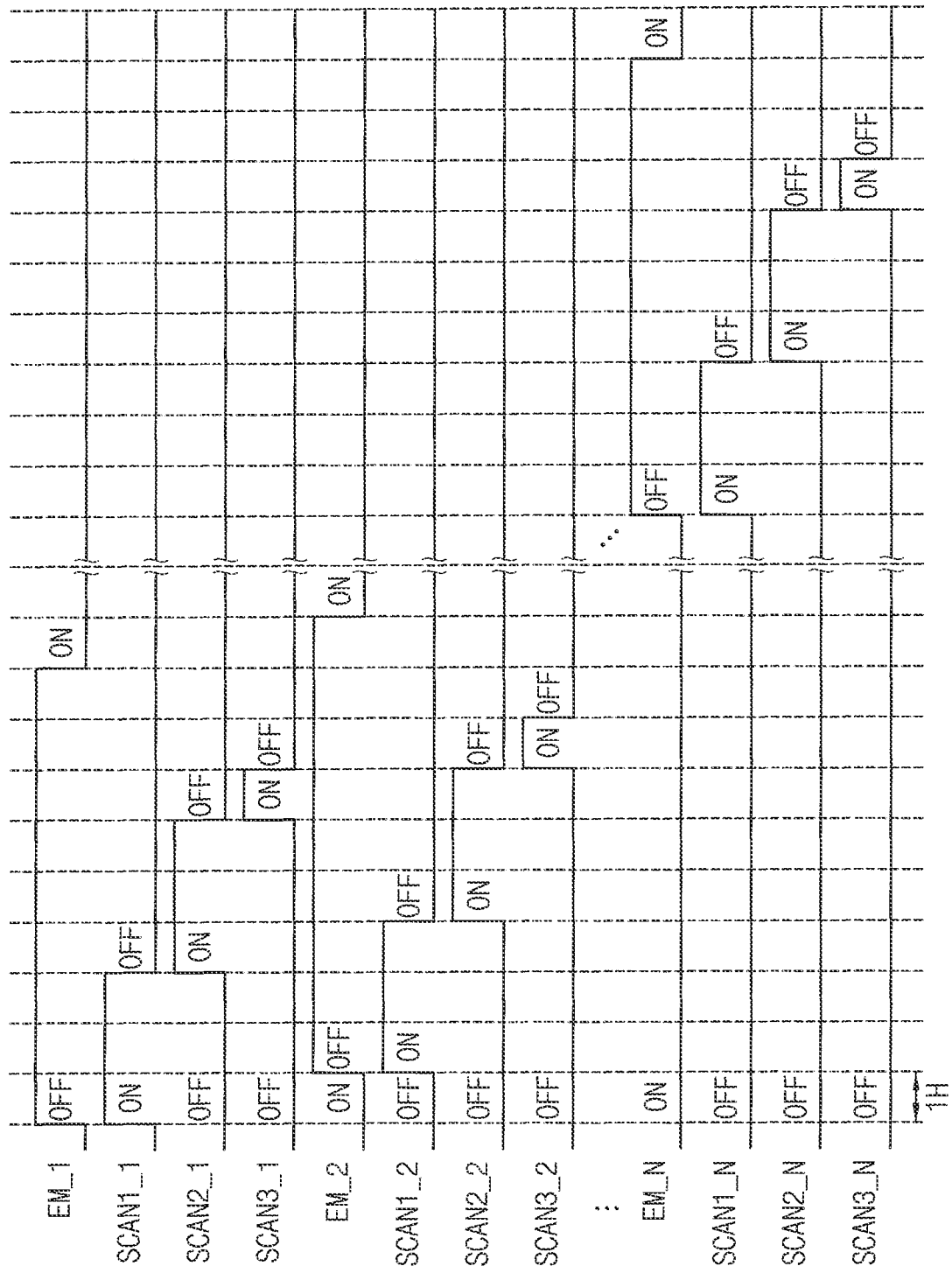
FIG. 17 is a timing diagram illustrating examples of an emission signal, a first scan signal, a second scan signal and a third scan signal in an OLED display device according to example embodiments.
Figure 18:
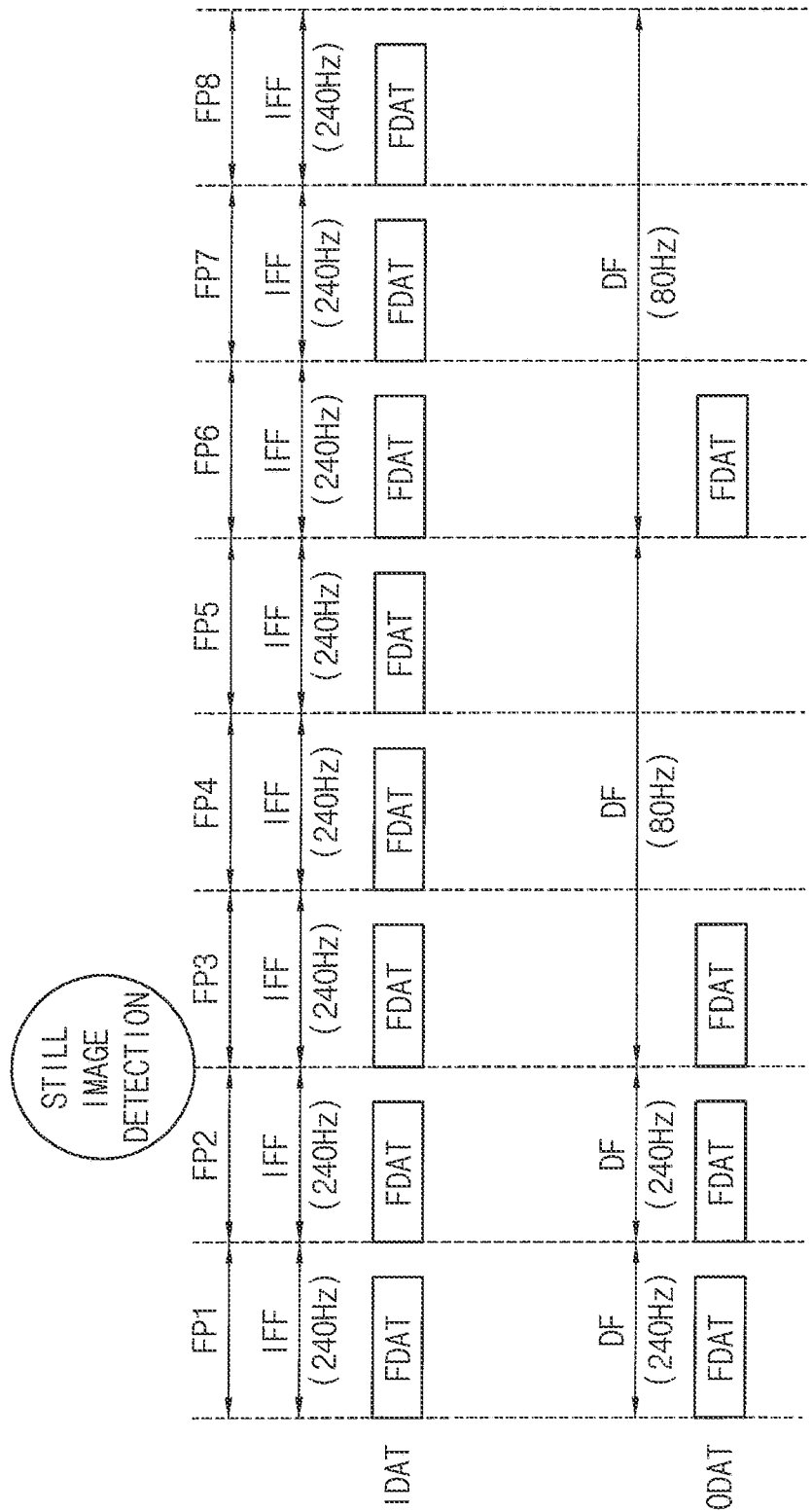
FIG. 18 is a timing diagram for describing an example of an operation of an OLED display device according to example embodiments.

FIG. 16 is a block diagram illustrating an OLED display device according to example embodiments, FIG. 17 is a timing diagram illustrating examples of an emission signal, a first scan signal, a second scan signal and a third scan signal in an OLED display device according to example embodiments, and FIG. 18 is a timing diagram for describing an example of an operation of an OLED display device according to example embodiments.

Referring to FIG. 16, an OLED display device 400 according to example embodiments may include a display panel 410, a data driver 420, a scan driver 430, an emission driver 440, and a controller 450.

The display panel 410 may include a plurality of pixels PX. According to example embodiments, each pixel PX may be a pixel 100 having a seven transistors and two capacitors (7T-2C) structure illustrated in FIG. 1, a pixel 200 having a seven transistors and two capacitors (7T-2C) structure illustrated in FIG. 9, and a pixel 300 having an eight transistors and two capacitors (8T-2C) structure illustrated in FIG. 11, or the like. As illustrated in FIG. 1, FIG. 9 or FIG. 11, a first transistor of the pixel PX may be implemented with a PMOS transistor, and one or more other transistors may be implemented with NMOS transistors. Accordingly, even if a driving frequency DF of the display panel 410 is changed, the pixel PX may emit light with substantially uniform luminance at the same gray level.

The data driver 420 may provide data voltages VDAT to the plurality of pixels PX based on a data control signal DCTRL and output image data ODAT received from the controller 450. In some example embodiments, the data control signal DCTRL may include, but not limited to, an output data enable signal, a horizontal start signal and a load signal. The data driver 420 may receive, as the output image data ODAT, frame data at the driving frequency DF of the display panel 410. In some example embodiments, the data driver 420 and the controller 450 may be implemented with a signal integrated circuit, and the signal integrated circuit may be referred to as a timing controller embedded data driver (TED). In other example embodiments, the data driver 420 and the controller 450 may be implemented with separate integrated circuits.

The scan driver 430 may provide a first scan signal SCAN1, a second scan signal SCAN2 and a third scan signal SCAN3 to the plurality of pixels PX based on a scan control signal SCTRL received from the controller 450. In some example embodiments, the scan control signal SCTRL may include, but not limited to, a scan start signal and a scan clock signal. In some example embodiments, the first scan signal SCAN1, the second scan signal SCAN2 and the third scan signal SCAN3 may be sequentially provided to the plurality of pixels PX on a row-by-row basis. For example, the display panel 410 may include N rows of the pixels PX, and, as illustrated in FIG. 17, the scan driver 430 may output the first, second and third scan signals SCAN1_1, SCAN2_1 and SCAN3_1 for a first row of the pixels PX, and may output the first, second and third scan signals SCAN1_2, SCAN2_2 and SCAN3_2 for a second row of the pixels PX which are shift by one horizontal time (1H time) compared with the first, second and third scan signals SCAN1_1, SCAN2_1 and SCAN3_1 for the first row of the pixels PX. In this manner, the scan driver 430 may shift the first, second and third scan signals SCAN1, SCAN2 and SCAN3 by one horizontal time (1H time) to sequentially output shift the first, second and third scan signals SCAN1, SCAN2 and SCAN3 on the row-by-row basis until the first, second and third scan signals SCAN1_N, SCAN2_N and SCAN3_N for the last row of the pixels PX are output. Although FIG. 17 illustrates an example corresponding to signals EM, SCAN1, SCAN2 and SCAN3 illustrated in FIG. 2, an operation of the scan driver 430 is not limited to the example of FIG. 17. For example, the scan driver 430 may operate in accordance with an example illustrated in FIG. 7, FIG. 8, FIG. 10, FIG. 12, or FIG. 14. In some example embodiments, in a case where each pixel PX is a pixel 300 of FIG. 11, the scan driver 430 may further provide a fourth scan signal SCAN4 to the plurality of pixels PX. In some example embodiments, the scan driver 430 may be integrated or formed in a peripheral portion of the display panel 410. In other example embodiments, the scan driver 430 may be implemented with one or more integrated circuits.

The emission driver 440 may provide an emission signal EM to the plurality of pixels PX based on an emission control signal EMCTRL received from the controller 450. In some example embodiments, the emission control signal EMCTRL may include, but not limited to, an emission start signal and an emission clock signal. In some example embodiments, the emission driver 440 may sequentially provide the emission signal EM to the plurality of pixels PX on a row-by-row basis. For example, the display panel 410 may include N rows of the pixels PX, and, as illustrated in FIG. 17, the emission driver 440 may output the emission signal EM_1 for a first row of the pixels PX, and may output the emission signal EM_2 for a second row of the pixels PX which are shift by one horizontal time (1H time) compared with the emission signal EM_1 for the first row of the pixels PX. In this manner, the emission driver 440 may shift the emission signal EM by one horizontal time (1H time) to sequentially output shift the emission signal EM on the row-by-row basis until the emission signal EM_N for the last row of the pixels PX is output. Although FIG. 17 illustrates an example corresponding to signals EM, SCAN1, SCAN2 and SCAN3 illustrated in FIG. 2, an operation of the emission driver 440 is not limited to the example of FIG. 17. For example, the emission driver 440 may operate in accordance with an example illustrated in FIG. 7, FIG. 8, FIG. 10, FIG. 12, or FIG. 14. In some example embodiments, the emission driver 440 may be integrated or formed in the peripheral portion of the display panel 410. In other example embodiments, the emission driver 440 may be implemented with one or more integrated circuits.

The controller 450 (e.g., a timing controller (TCON)) may receive input image data IDAT and a control signal CTRL from an external host processor (e.g., an application processor (AP), a graphic processing unit (GPU) or a graphic card). In some example embodiments, the control signal CTRL may include, but not limited to, a vertical synchronization signal, a horizontal synchronization signal, an input data enable signal, and a master clock signal, etc. The controller 450 may generate the output image data ODAT, the data control signal DCTRL, the scan control signal SCTRL and the emission control signal EMCTRL based on the input image data IDAT, and the control signal CTRL. The controller 450 may control an operation of the data driver 420 by providing the output image data ODAT and the data control signal DCTRL to the data driver 420, may control an operation of the scan driver 430 by providing the scan control signal SCTRL to the scan driver 430, and may control an operation of the emission driver 440 by providing the emission control signal EMCTRL to the emission driver 440.

In some example embodiments, the controller 450 of the OLED display device 400 may change the driving frequency DF of the display panel 410 by analyzing the input image data IDAT. For example, the OLED display device 400 may drive the display panel 410 at a normal driving frequency (e.g., about 240 Hz) or an input frame frequency IFF of the input image data IDAT in a case where the input image data IDAT represent a moving image, and may drive the display panel 410 at a low frequency lower than the normal driving frequency or the input frame frequency IFF in a case where the input image data IDAT represent a still image. Thus, even if the controller 450 receives the input image data IDAT at the fixed input frame frequency IFF (e.g., about 240 Hz), the controller 450 may provide the output image data ODAT to the data driver 420 at the driving frequency DF in a wide driving frequency range (e.g., from about 10 Hz to about 240 Hz). For example, as illustrated in FIG. 18, in first and second frame periods FP1 and FP2 where the input image data IDAT represent the moving image, the controller 450 may receive frame data FDAT at the input frame frequency IFF of about 240 Hz, and may provide, as the output image data ODAT, the frame data FDAT to the data driver 420 at the driving frequency DF of about 240 Hz that is substantially the same as the input frame frequency IFF. Accordingly, the display panel 410 may be driven at the driving frequency DF of about 240 Hz. If the still image is detected, the controller 450 may determine the driving frequency DF of the display panel 410 as a low frequency, for example about 80 Hz lower than the input frame frequency IFF of about 240 Hz. In a case where the input image data IDAT represent the still image, the controller 450 may provide the frame data FDAT to the data driver 420 in third and sixth frame periods FP3 and FP6, and may not provide the frame data FDAT to the data driver 420 in fourth, fifth, seventh and eighth frame periods FP4, FP5, FP7, and FP8. Accordingly, in the third through eighth frame periods FP3 through FP8, the controller 450 may provide the frame data FDAT to the data driver 420 at the driving frequency DF of about 80 Hz which is one third of the input frame frequency IFF of about 240 Hz, and the data driver 420 may drive the display panel 410 at the driving frequency DF of about 80 Hz. Although FIG. 18 illustrates an example where the display panel 410 is driven at the driving frequency DF of about 240 Hz or the driving frequency DF of about 80 Hz, in some example embodiments, the display panel 410 may be driven at the driving frequency DF in the wide driving frequency range (e.g., from about 10 Hz to about 240 Hz).

Further, although FIG. 18 illustrates an example where the controller 450 receives the input image data IDAT at the fixed input frame frequency IFF of about 240 Hz, in other example embodiments, the controller 450 may receive the input image data IDAT at a variable input frame frequency IFF (e.g., from about 10 Hz to about 240 Hz). In this case, the controller 450 may drive the display panel 410 at the variable driving frequency DF corresponding to the variable input frame frequency IFF.

As described above, the driving frequency DF of the display panel 410 may be changed. However, in the OLED display device 400 according to example embodiments, one or more transistors of each pixel PX of the display panel 410 may be implemented with NMOS transistors. Accordingly, even if the driving frequency DF of the display panel 410 is changed, each pixel PX may emit light with substantially uniform luminance at the same gray level.

Figure 19:
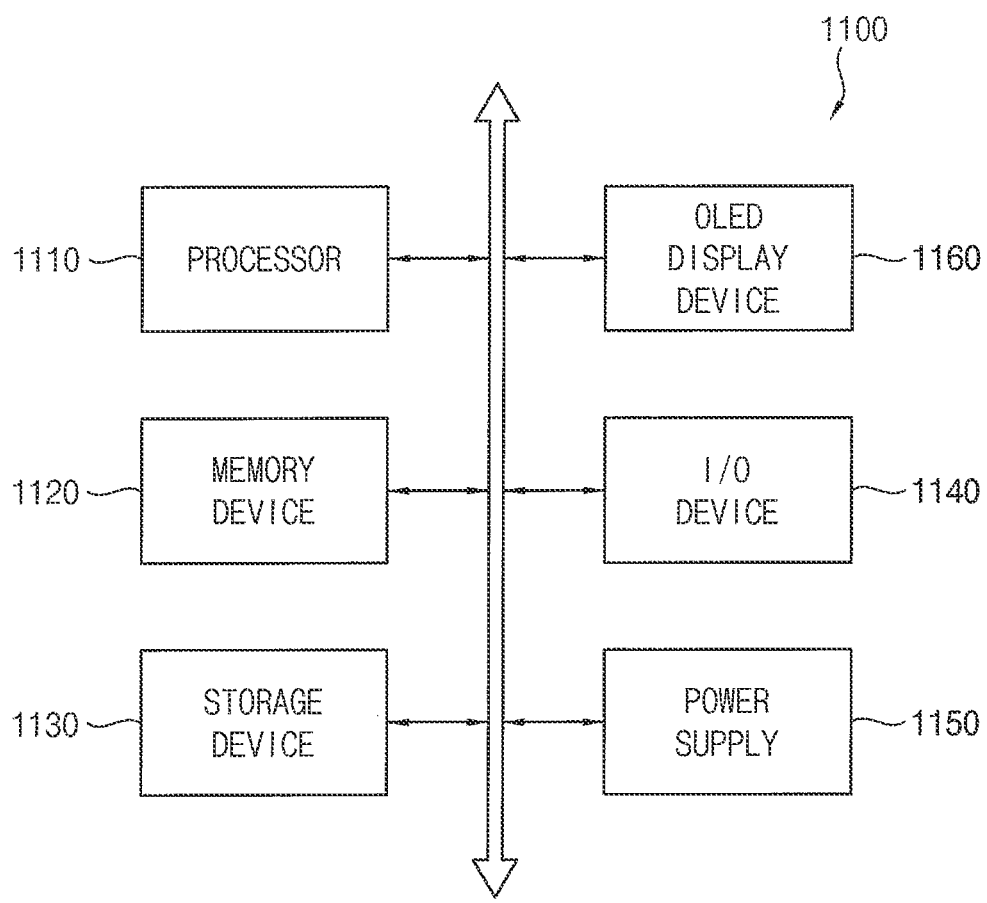
FIG. 19 is an electronic device including an OLED display device according to example embodiments.

FIG. 19 is an electronic device including an OLED display device according to example embodiments.

Referring to FIG. 19, an electronic device 1100 may include a processor 1110, a memory device 1120, a storage device 1130, an input/output (I/O) device 1140, a power supply 1150, and an OLED display device 1160. Although not shown in FIG. 19, the electronic device 1100 may further include a plurality of ports for communicating a video card, a sound card, a memory card, a universal serial bus (USB) device, other electric devices, etc.

The processor 1110 may perform various computing functions or tasks. The processor 1110 may be an application processor (AP), a micro processor, a central processing unit (CPU), etc. The processor 1110 may be coupled to other components via an address bus, a control bus, and a data bus, etc. Further, in some example embodiments, the processor 1110 may be further coupled to an extended bus such as a peripheral component interconnection (PCI) bus.

The memory device 1120 may store data for operations of the electronic device 1100. For example, the memory device 1120 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, and a mobile dynamic random access memory (mobile DRAM) device, etc.

The storage device 1130 may be a solid state drive (SSD) device, a hard disk drive (HDD) device, and a CD-ROM device, etc. The I/O device 1140 may be an input device such as a keyboard, a keypad, a mouse, and a touch screen, etc, and an output device such as a printer and a speaker, etc. The power supply 1150 may supply power for operations of the electronic device 1100. The OLED display device 1160 may be coupled to other components through the buses or other communication links.

In the OLED display device 1160, each pixel may include a first transistor, a second transistor, a third transistor, a fourth transistor, a fifth transistor, a sixth transistor, a seventh transistor, a first capacitor, a second capacitor, and an organic light emitting diode, and a portion of the first through seventh transistors may be implemented with an NMOS transistor. Accordingly, even if a driving frequency of a display panel including the pixel is changed, the pixel may emit light with substantially uniform luminance at the same gray level.

The disclosure may be applied to any OLED display device 1160, and any electronic device 1100 including the OLED display device 1160. For example, the disclosure may be applied to a mobile phone, a smart phone, a wearable electronic device, a tablet computer, a television (TV), a digital TV, a 3D TV, a personal computer (PC), a home appliance, a laptop computer, a personal digital assistant (PDA), a portable multimedia player (PMP), a digital camera, a music player, a portable game console, and a navigation device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A pixel of an organic light emitting diode (OLED) display device, the pixel comprising:
a first transistor including a gate electrode coupled to a first node, a first terminal coupled to a line of a first power supply voltage, and a second terminal;
a second transistor including a gate receiving a first scan signal, a first terminal coupled to a line of an initialization voltage, and a second terminal coupled to the first node;
a third transistor including a gate receiving the first scan signal, a first terminal coupled to the line of the initialization voltage, and a second terminal coupled to an anode of an organic light emitting diode;
a fourth transistor including a gate receiving a second scan signal, a first terminal coupled to a line of a reference voltage, and a second terminal coupled to a second node;

a fifth transistor including a gate receiving the second scan signal, a first terminal coupled to the second terminal of the first transistor, and a second terminal coupled to the first node;

a sixth transistor including a gate receiving a third scan signal, a first terminal coupled to a data line, and a second terminal coupled to the second node;

a seventh transistor including a gate receiving an emission signal, a first terminal coupled to the second terminal of the first transistor, and a second terminal coupled to the anode of the organic light emitting diode;

a first capacitor including a first electrode coupled to the line of the first power supply voltage and a second electrode coupled to the second node;

a second capacitor including a first electrode coupled to the second node and a second electrode coupled to the first node; and the organic light emitting diode including the anode and a cathode coupled to a line of a second power supply voltage, wherein the first terminal of the second transistor is directly connected to the first terminal of the third transistor, and wherein the second terminal of the third transistor is directly connected to the second terminal of the seventh transistor.

2. The pixel of claim 1, wherein the first and seventh transistors are PMOS transistors, and wherein the second, third, fourth, fifth, and sixth transistors are NMOS transistors.

3. The pixel of claim 1, wherein a frame period for the pixel includes:

a gate and anode initialization period in which the gate of the first transistor and the anode of the organic light emitting diode are initialized;

a threshold voltage compensation period in which a threshold voltage of the first transistor is compensated;

a data writing period in which a data voltage of the data line is applied to the second node; and an emission period in which the organic light emitting diode emits light.

4. The pixel of claim 3, wherein, in the gate and anode initialization period, the emission signal has an off level, the first scan signal has an on level, and the second and third scan signals have off levels respectively, the second and third transistors are turned on, the second transistor applies the initialization voltage to the first node, and the third transistor applies the initialization voltage to the anode of the organic light emitting diode.

5. The pixel of claim 3, wherein, in the threshold voltage compensation period, the emission signal has an off level, the second scan signal has an on level, and the first and third scan signals have off levels respectively, the fourth and fifth transistors are turned on, the fourth transistor applies the reference voltage to the second node, the fifth transistor diode-connects the first transistor, and a voltage where the threshold voltage is subtracted from the first power supply voltage is applied through the diode-connected first transistor to the first node.

6. The pixel of claim 3, wherein, in the data writing period, the emission signal has an off level, the third scan signal has an on level, and the first and second scan signals have off levels respectively, the sixth transistor is turned on, and the sixth transistor applies the data voltage to the second node.

7. The pixel of claim 3, wherein, in the emission period, the emission signal has an on level, and the first, second, and third scan signals have off levels respectively, the seventh transistor is turned on, the first transistor generates a driving current based on a voltage of the first node, and the seventh transistor provides the driving current to the organic light emitting diode.

8. The pixel of claim 3, wherein a time length of the threshold voltage compensation period is longer than a time length of the data writing period.

9. The pixel of claim 3, wherein the gate and anode initialization period, the threshold voltage compensation period, and the data writing period have an equal time length.

10. The pixel of claim 1, further comprising:

an eighth transistor including a gate receiving a fourth scan signal, a first terminal receiving the emission signal, and a second terminal coupled to the second terminal of the first transistor.

11. The pixel of claim 10, wherein the first transistor is a PMOS transistor, and wherein the second, third, fourth, fifth, sixth, seventh and eighth transistors are NMOS transistors.

12. The pixel of claim 10, wherein, a frame period for the pixel includes:

a gate and anode initialization period in which the gate of the first transistor and the anode of the organic light emitting diode are initialized;

a drain initialization period in which the second terminal of the first transistor is initialized;

a threshold voltage compensation period in which a threshold voltage of the first transistor is compensated;

a data writing period in which a data voltage of the data line is applied to the second node; and an emission period in which the organic light emitting diode emits light.

13. The pixel of claim 12, wherein, in the drain initialization period, the emission signal has an off level, the fourth scan signal has an on level, and the first, second and third scan signals have off levels respectively, the eighth transistor is turned on, and the eighth transistor applies the emission signal having the off level to the second terminal of the first transistor.

14. The pixel of claim 12, wherein the drain initialization period is located between the gate and anode initialization period and the threshold voltage compensation period, and does not overlap the gate and anode initialization period and the threshold voltage compensation period.

15. The pixel of claim 12, wherein the drain initialization period is located between the gate and anode initialization period and the threshold voltage compensation period, and partially overlaps the gate and anode initialization period and the threshold voltage compensation period.

16. The pixel of claim 15, wherein, in a period where the drain initialization period and the threshold voltage compensation period overlap each other, the emission signal has an off level, the second and fourth scan signals have on levels respectively, and the first and third scan signals have off levels respectively, the fifth and eighth transistors are turned on, and
the emission signal having the off level is applied through the eighth transistor and the fifth transistor to the first node.

17. A pixel of an organic light emitting diode (OLED) display device, the pixel comprising:
a first transistor including a gate electrode coupled to a first node, a first terminal coupled to a line of a first power supply voltage, and a second terminal;
a second transistor including a gate receiving a first scan signal, a first terminal coupled to a line of an initialization voltage, and a second terminal coupled to the first node;
a third transistor including a gate receiving a fourth scan signal, a first terminal coupled to the line of the initialization voltage, and a second terminal coupled to an anode of an organic light emitting diode;
a fourth transistor including a gate receiving a second scan signal, a first terminal coupled to a line of a reference voltage, and a second terminal coupled to a second node;
a fifth transistor including a gate receiving the second scan signal, a first terminal coupled to the second terminal of the first transistor, and a second terminal coupled to the first node;
a sixth transistor including a gate receiving a third scan signal, a first terminal coupled to a data line, and a second terminal coupled to the second node;
a seventh transistor including a gate receiving an emission signal, a first terminal coupled to the second terminal of the first transistor, and a second terminal coupled to the anode of the organic light emitting diode;
a first capacitor including a first electrode coupled to the line of the first power supply voltage and a second electrode coupled to the second node;
a second capacitor including a first electrode coupled to the second node and a second electrode coupled to the first node; and
the organic light emitting diode including the anode and a cathode coupled to a line of a second power supply voltage,
wherein the first terminal of the second transistor is directly connected to the first terminal of the third transistor, and
wherein the second terminal of the third transistor is directly connected to the second terminal of the seventh transistor.

18. The pixel of claim 17, wherein the first, third, and seventh transistors are PMOS transistors, and
wherein the second, fourth, fifth, and sixth transistors are NMOS transistors.

19. The pixel of claim 17, wherein the fourth scan signal is an inverted version of the first scan signal.

20. An organic light emitting diode (OLED) display device comprising:
a display panel including a plurality of pixels;
a data driver configured to provide data signals to the plurality of pixels;
a scan driver configured to provide a first scan signal, a second scan signal, and a third scan signal to the plurality of pixels;
an emission driver configured to provide an emission signal to the plurality of pixels; and
a controller configured to control the data driver, the scan driver, and the emission driver,
wherein each of the plurality of pixels includes:
a first transistor including a gate electrode coupled to a first node, a first terminal coupled to a line of a first power supply voltage, and a second terminal;
a second transistor including a gate receiving a first scan signal, a first terminal coupled to a line of an initialization voltage, and a second terminal coupled to the first node;
a third transistor including a gate receiving the first scan signal, a first terminal coupled to the line of the initialization voltage, and a second terminal coupled to an anode of an organic light emitting diode;
a fourth transistor including a gate receiving a second scan signal, a first terminal coupled to a line of a reference voltage, and a second terminal coupled to a second node;
a fifth transistor including a gate receiving the second scan signal, a first terminal coupled to the second terminal of the first transistor, and a second terminal coupled to the first node;
a sixth transistor including a gate receiving a third scan signal, a first terminal coupled to a data line, and a second terminal coupled to the second node;
a seventh transistor including a gate receiving an emission signal, a first terminal coupled to the second terminal of the first transistor, and a second terminal coupled to the anode of the organic light emitting diode;
a first capacitor including a first electrode coupled to the line of the first power supply voltage and a second electrode coupled to the second node;
a second capacitor including a first electrode coupled to the second node and a second electrode coupled to the first node; and
the organic light emitting diode including the anode and a cathode coupled to a line of a second power supply voltage,
wherein the first terminal of the second transistor is directly connected to the first terminal of the third transistor, and
wherein the second terminal of the third transistor is directly connected to the second terminal of the seventh transistor.

* * * * *